US010515887B2

(12) United States Patent
Syu et al.

(10) Patent No.: US 10,515,887 B2
(45) Date of Patent: Dec. 24, 2019

(54) FAN-OUT PACKAGE STRUCTURE HAVING STACKED CARRIER SUBSTRATES AND METHOD FOR FORMING THE SAME

(71) Applicant: MEDIATEK INC., Hsin-Chu (TW)

(72) Inventors: Shih-Yi Syu, Hsin-Chu (TW); Chia-Yu Jin, Hsin-Chu (TW); Che-Ya Chou, Hsin-Chu (TW); Wen-Sung Hsu, Hsin-Chu (TW); Nan-Cheng Chen, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/700,220

(22) Filed: Sep. 11, 2017

(65) Prior Publication Data
US 2018/0082936 A1    Mar. 22, 2018

Related U.S. Application Data

(60) Provisional application No. 62/396,906, filed on Sep. 20, 2016.

(51) Int. Cl.
*H01L 23/498*   (2006.01)
*H01L 25/065*   (2006.01)
(Continued)

(52) U.S. Cl.
CPC ...... *H01L 23/49833* (2013.01); *H01L 21/563* (2013.01); *H01L 23/3107* (2013.01);
(Continued)

(58) Field of Classification Search
CPC ............... H01L 21/4857; H01L 21/563; H01L 23/3107; H01L 23/3135; H01L 23/3675; H01L 23/49833
See application file for complete search history.

(56) References Cited

U.S. PATENT DOCUMENTS 7,968,979 B2 * 6/2011 Pagaila ............... H01L 23/3128
257/660
8,564,125 B2 * 10/2013 Cho ..................... H01L 25/0657
257/713
(Continued)

FOREIGN PATENT DOCUMENTS

CN    101593734 A    12/2009
CN    102573279 A     7/2012
(Continued)

*Primary Examiner* — Mark W Tornow
*Assistant Examiner* — Abbigale A Boyle
(74) *Attorney, Agent, or Firm* — Wolf, Greenfield & Sacks, P.C.

(57) ABSTRACT

A semiconductor package structure is provided. The semiconductor package structure includes a first carrier substrate having a first surface and an opposing second surface. A second carrier substrate is stacked on the first carrier substrate and has a first surface and an opposing second surface that faces the first surface of the first carrier substrate. A semiconductor die is mounted on the first surface of the second carrier substrate. A heat spreader is disposed on the first surface of the first carrier substrate to cover and surround the second carrier substrate and the semiconductor die. A method for forming the semiconductor package structure is also provided.

23 Claims, 28 Drawing Sheets

(51) Int. Cl.
*H01L 21/56* (2006.01)
*H01L 23/31* (2006.01)
*H01L 23/42* (2006.01)
*H01L 23/64* (2006.01)
*H01L 23/367* (2006.01)
*H01L 23/433* (2006.01)
*H01L 21/48* (2006.01)
*H01L 23/00* (2006.01)

(52) U.S. Cl.
CPC ...... *H01L 23/3135* (2013.01); *H01L 23/3675* (2013.01); *H01L 23/42* (2013.01); *H01L 23/4334* (2013.01); *H01L 23/642* (2013.01); *H01L 25/0657* (2013.01); *H01L 21/4857* (2013.01); *H01L 23/49816* (2013.01); *H01L 24/13* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01); *H01L 2224/131* (2013.01); *H01L 2224/1308* (2013.01); *H01L 2224/16227* (2013.01); *H01L 2224/32225* (2013.01); *H01L 2224/32245* (2013.01); *H01L 2224/73204* (2013.01); *H01L 2224/73253* (2013.01); *H01L 2224/81815* (2013.01); *H01L 2224/83191* (2013.01); *H01L 2224/92125* (2013.01); *H01L 2224/92225* (2013.01); *H01L 2924/1431* (2013.01); *H01L 2924/1432* (2013.01); *H01L 2924/15311* (2013.01); *H01L 2924/164* (2013.01); *H01L 2924/16251* (2013.01); *H01L 2924/18161* (2013.01); *H01L 2924/19041* (2013.01); *H01L 2924/19105* (2013.01); *H01L 2924/19106* (2013.01)

(56) References Cited

U.S. PATENT DOCUMENTS

| | | |
|---|---|---|
| 2004/0056277 A1 | 3/2004 | Kamezos |
| 2004/0063242 A1* | 4/2004 | Karnezos ............ H01L 23/3128 438/106 |
| 2004/0080041 A1 | 4/2004 | Kimura |
| 2009/0294938 A1 | 12/2009 | Chen |
| 2012/0119346 A1 | 5/2012 | Im et al. |
| 2012/0193779 A1* | 8/2012 | Lee ..................... H01L 23/3128 257/737 |
| 2014/0131856 A1 | 5/2014 | Do et al. |
| 2014/0252544 A1 | 9/2014 | Li et al. |

FOREIGN PATENT DOCUMENTS

| | | |
|---|---|---|
| CN | 104904006 A | 9/2015 |
| EP | 3 300 106 A1 | 3/2018 |
| TW | 201519382 A | 5/2015 |

* cited by examiner

FAN-OUT PACKAGE STRUCTURE HAVING STACKED CARRIER SUBSTRATES AND METHOD FOR FORMING THE SAME

CROSS REFERENCE TO RELATED APPLICATIONS

This application claims the benefit of U.S. Provisional Application No. 62/396,906 filed on Sep. 20, 2016, the entirety of which is incorporated by reference herein.

BACKGROUND OF THE INVENTION

Field of the Invention

The present invention relates to a semiconductor package structure, and in particular to a highly cost-effective fan-out package structure and a method for forming the same.

Description of the Related Art

In the semiconductor packaging industry, there is a demand for reducing the manufacturing cost of semiconductor packages. To accomplish this, various package structure designs have been developed. One of the package structure designs currently in use is the flip-chip package structure. The adoption of a flip chip package structure in many applications is driven by performance needs and the ability to achieve a smaller die with a flip chip design.

In a flip-chip package structure, a semiconductor die (also referred to as an integrated circuit (IC) chip or "chip") that is formed with solder bumps is typically bonded directly to metal pads of a package substrate. Such solder bumps are affixed to I/O bonding pads of the semiconductor die. During packaging, the semiconductor die is "flipped" so that the solder bumps form electrical interconnections between the semiconductor die and the packaging substrate.

In order to ensure miniaturization and multi-functionality of electronic products, it is desired that semiconductor packages are small in size, operate at high speeds, and have high functionality. Accordingly, the semiconductor die utilizes the package substrate to serve as a fan-out layer.

However, in order to respond to the increase in I/O pads, a complicated multilayer interconnect structure is formed in the package substrate. As a result, the manufacturing cost of the package substrate is greatly increased, while the yield of the package substrate is reduced. These cause reductions in the reliability, yield, and throughput of the semiconductor package structure, while the manufacturing cost of the semiconductor package structure goes up.

Thus, a novel semiconductor package structure is desirable.

BRIEF SUMMARY OF THE INVENTION

Semiconductor package structures and methods for forming the same are provided. An exemplary embodiment of a semiconductor package structure includes a first carrier substrate having a first surface and an opposing second surface. A second carrier substrate is stacked on the first carrier substrate and has a first surface and an opposing second surface that faces the first surface of the first carrier substrate. A semiconductor die is mounted on the first surface of the second carrier substrate. A heat spreader is disposed on the first surface of the first carrier substrate to cover and surround the second carrier substrate and the semiconductor die.

Another exemplary embodiment of a semiconductor package structure includes a first carrier substrate having a first surface and an opposing second surface. A second carrier substrate is stacked on the first carrier substrate and has a first surface and an opposing second surface that faces the first surface of the first carrier substrate. A semiconductor die is mounted on the first surface of the second carrier substrate. A first encapsulating material is disposed on the first surface of the second carrier substrate and surrounds the semiconductor die. A heat spreader is disposed on the first surface of the first carrier substrate to cover and surround the second carrier substrate and the first encapsulating material.

An exemplary embodiment of a method for forming a semiconductor package structure includes providing a first carrier substrate having a first surface and an opposing second surface and a second carrier substrate having a first surface and an opposing second surface. The second carrier substrate is stacked on the first carrier substrate. The second surface of the second carrier substrate faces the first surface of the first carrier substrate. A semiconductor die is stacked on the first surface of the second carrier substrate. A heat spreader is formed on the first surface of the first carrier substrate to cover and surround the second carrier substrate and the semiconductor die.

Another exemplary embodiment of a method for forming a semiconductor package structure includes providing a second carrier substrate having a first surface and an opposing second surface. A semiconductor die is mounted on the first surface of the second carrier substrate. A first encapsulating material is formed on the first surface of the second carrier substrate to surround the semiconductor die. A first carrier substrate having a first surface and an opposing second surface is provided. The second carrier substrate with the semiconductor die and the first encapsulating material is mounted on the first surface of the first carrier substrate. A heat spreader id formed on the first surface of the first carrier substrate to cover and surround the second carrier substrate and the first encapsulating material.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 1E-1 is a cross-sectional view of a semiconductor package structure in accordance with some embodiments of the disclosure.

FIG. 1E-2 is a cross-sectional view of a semiconductor package structure in accordance with some embodiments of the disclosure

DETAILED DESCRIPTION OF THE INVENTION

Figure 1A:
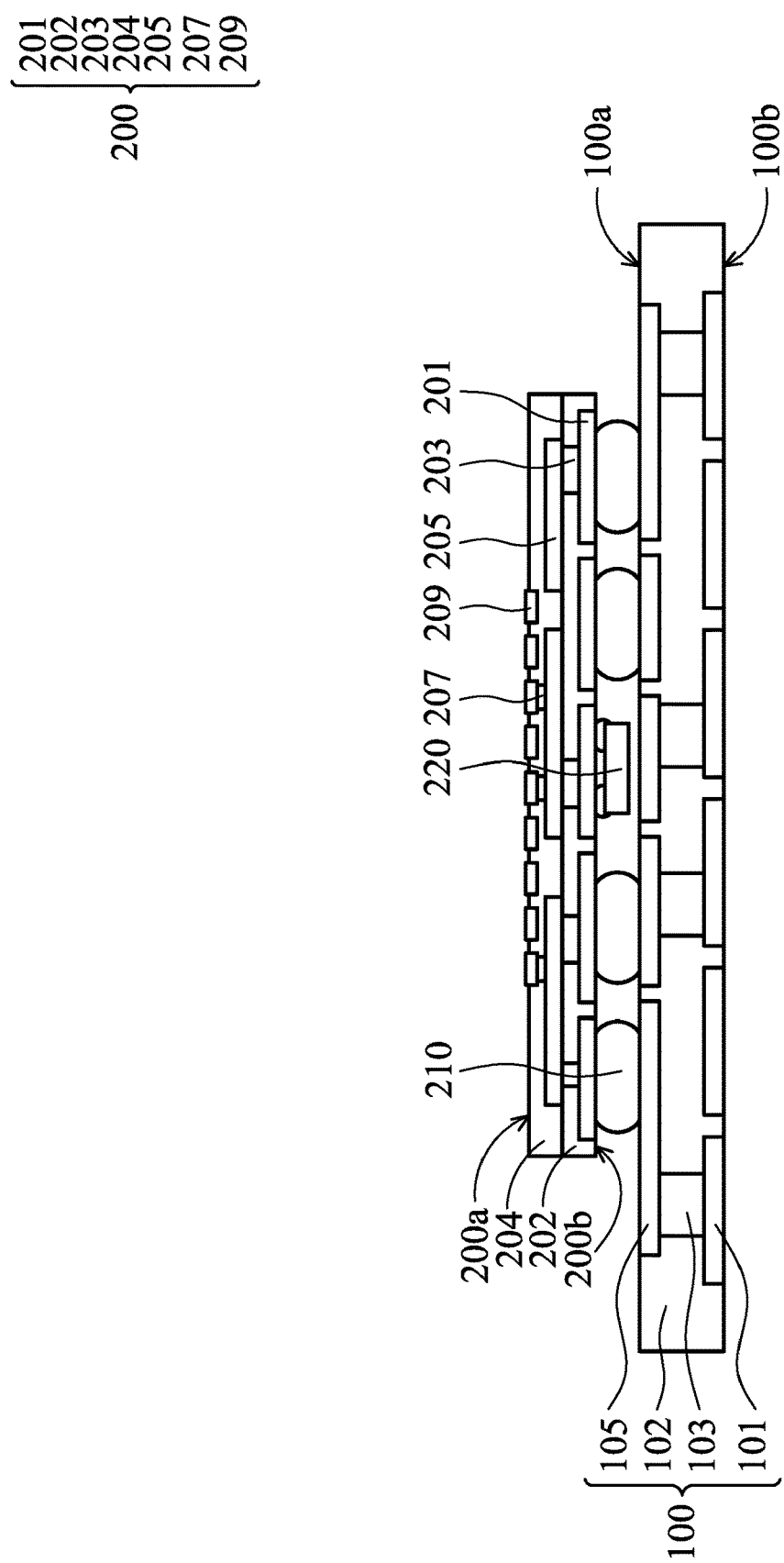
FIGS. 1A to 1E are cross-sectional views of various stages of a method for forming a semiconductor package structure, in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 1B:
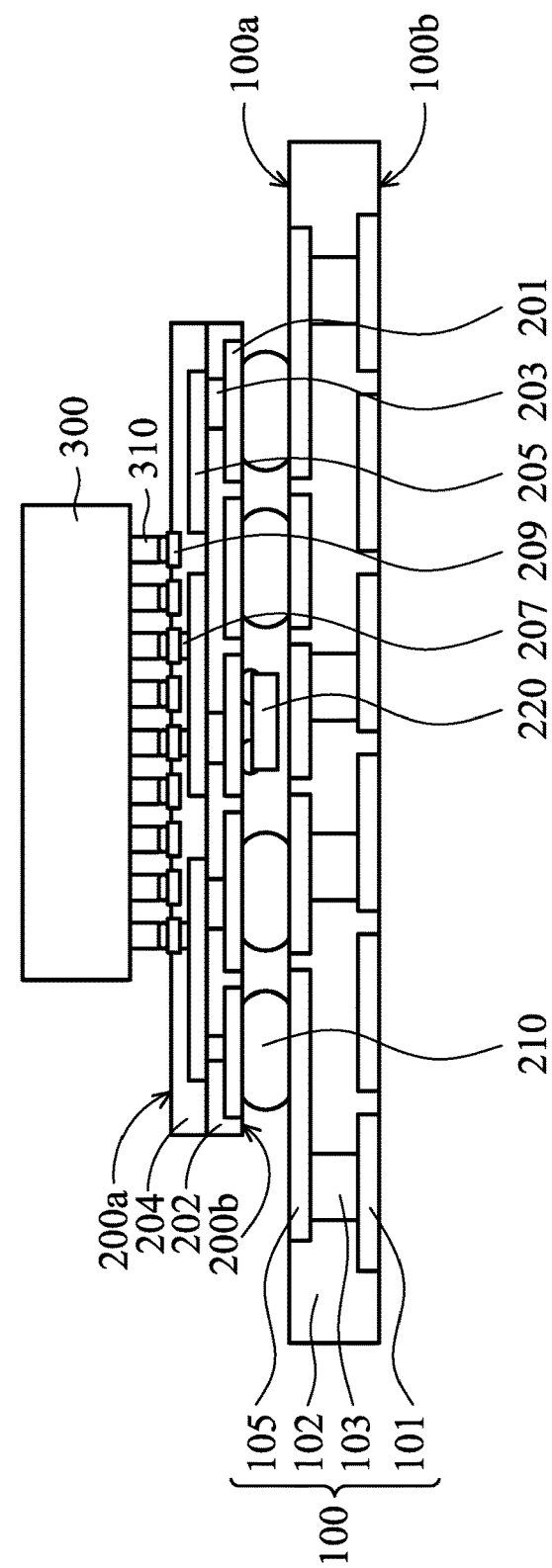
Figure 1C:
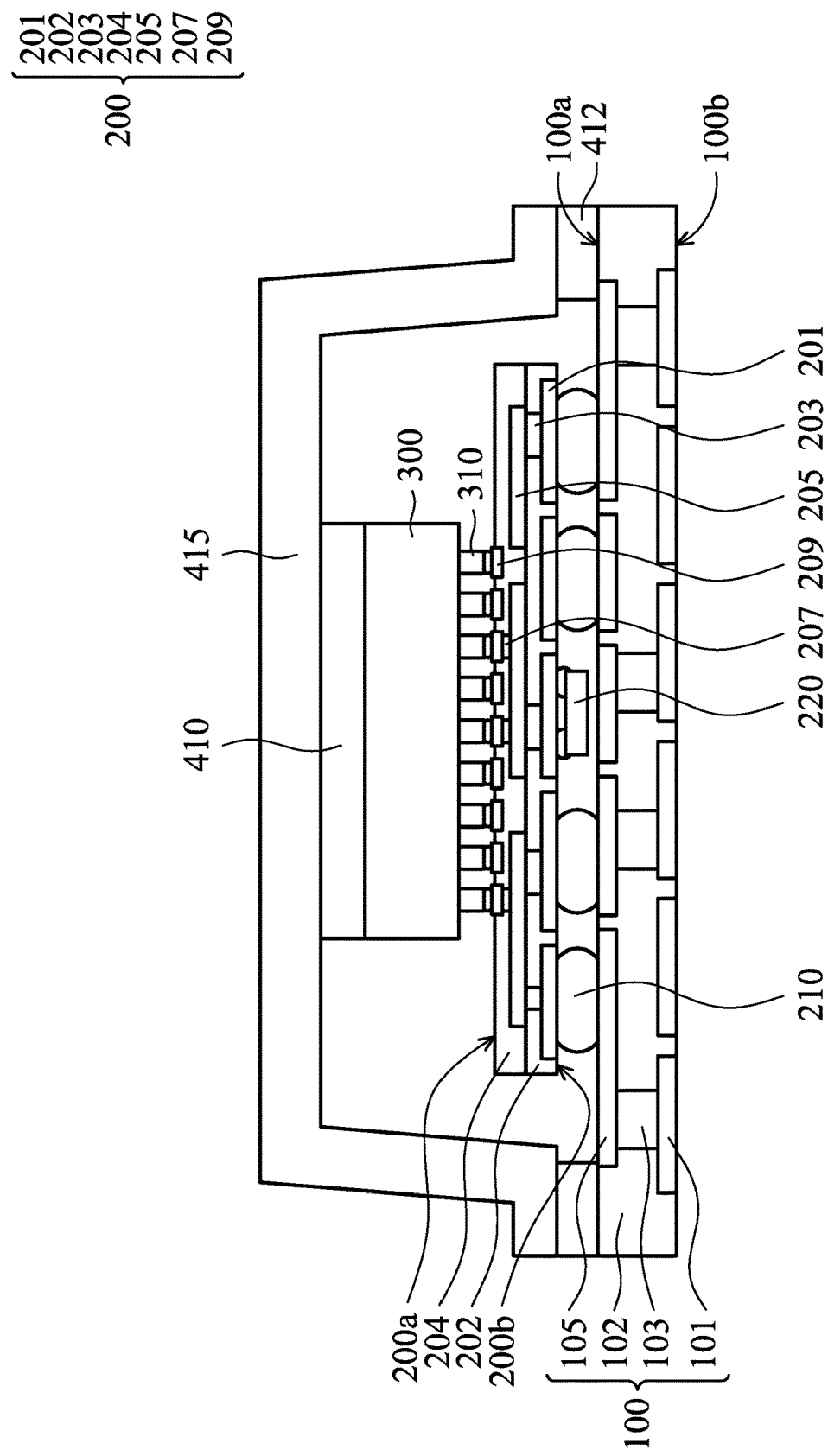
Figure 1D:
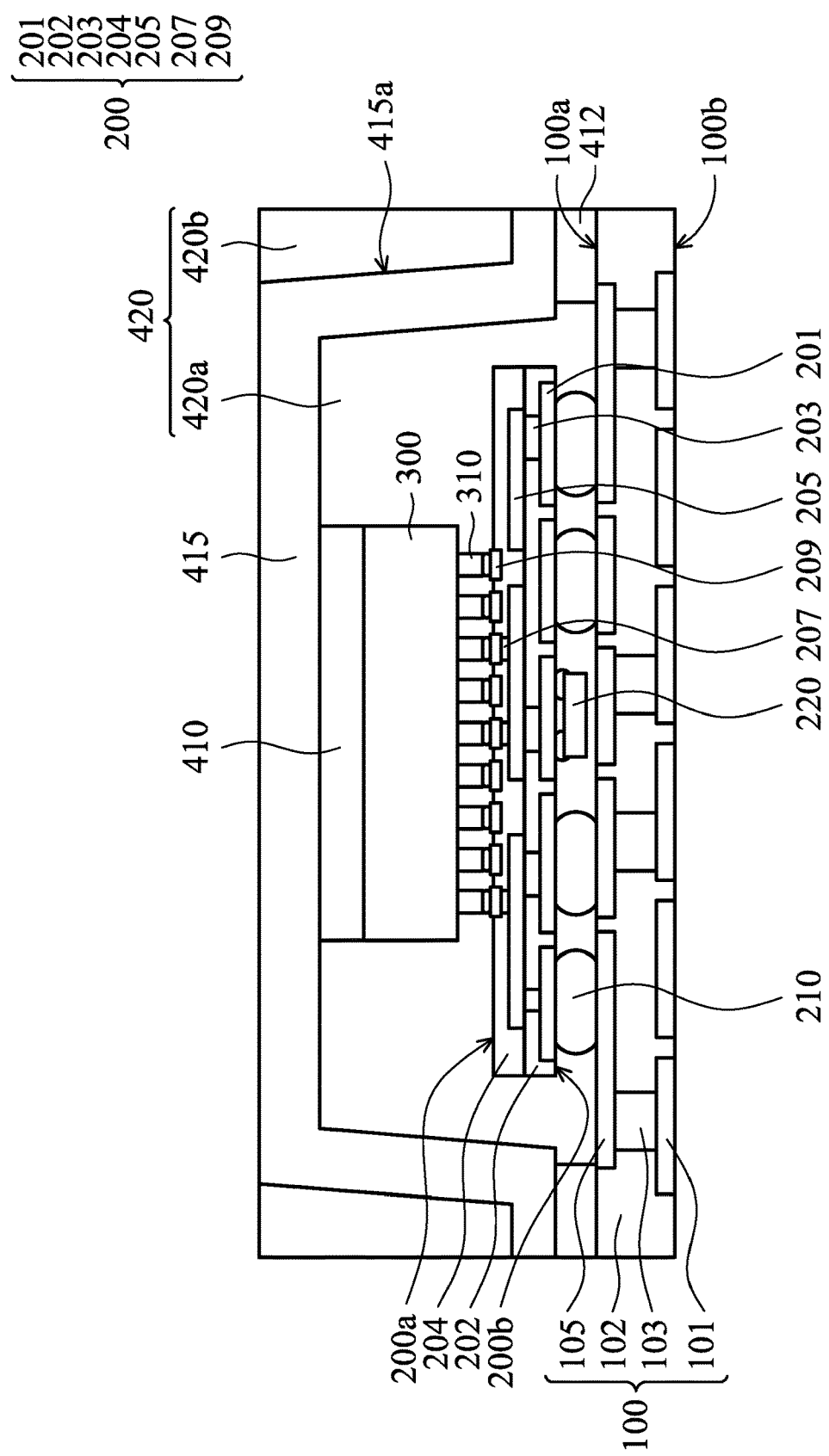
Figure 1E:
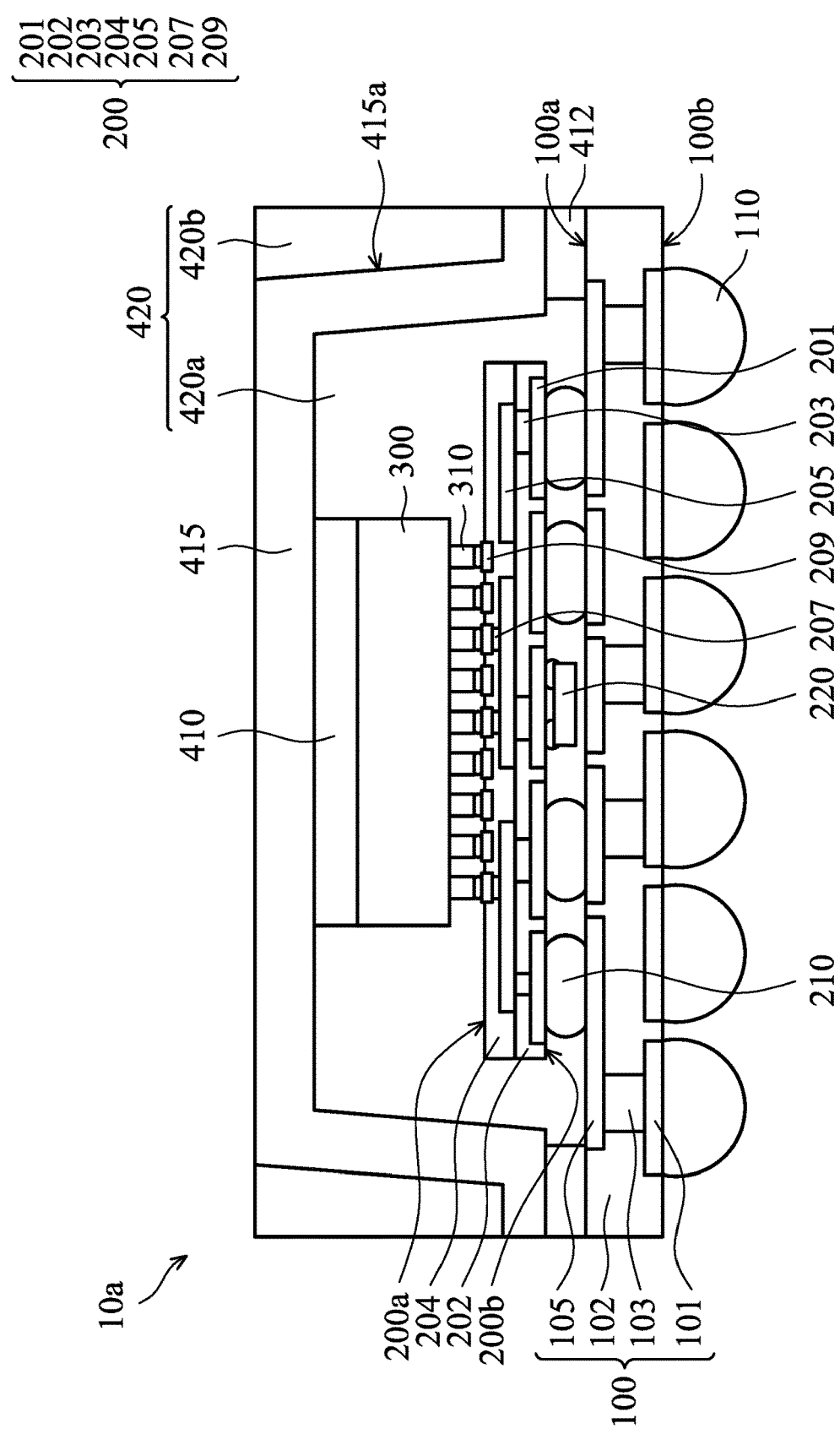

FIG. 1E is a cross-sectional view of a semiconductor package structure 10a in accordance with some embodiments of the disclosure. In some embodiments, the semiconductor package structure 10a is a wafer-level semiconductor package structure, for example, a fan-out wafer-level semiconductor package structure. In one embodiment, the fan-out wafer-level semiconductor package structure may include a flip chip package structure.

Referring to FIG. 1E, the semiconductor package structure 10a may be mounted on a base (not shown), such as a printed circuit board (PCB), that is formed of polypropylene (PP), polybenzoxazole (PBO) or polyimide. In some embodiments, the base may be a single layer or a multilayer structure. Conductive pads and conductive traces electrically coupled to the conductive pads are typically disposed on the top surface of the base and/or in the base. In this case, the conductive traces may be used for the input/output (I/O) connections of the semiconductor package structure 10a. In some embodiments, the semiconductor package structure 10a is mounted on the base by a bonding process. For example, the first semiconductor package 10a includes bumps 110 that are mounted on and electrically coupled to the base by the bonding process.

In some embodiments, the semiconductor package structure 10a includes a first carrier substrate 100, a second carrier substrate 200 stacked on the first carrier substrate 200 and a semiconductor die 300 mounted on the second carrier substrate 200. For example, the first carrier substrate 100 has a first surface 100a and an opposing second surface 100b. Moreover, the second carrier substrate 200 has a first surface 200a and an opposing second surface 200b. The second carrier substrate 200 may be stacked on the first carrier substrate 100, so that the second surface 200b of the second carrier substrate 200 faces the first surface 100a of the first carrier substrate 100. Moreover, the semiconductor die 300 is mounted on the first surface 200a of the second carrier substrate 200.

The first carrier substrate 100 and the second carrier substrate 200 may serve as fan-out layers for the semiconductor die 300 and may also be referred to as package substrate. In some embodiments, the first carrier substrate 100 is a single layered package substrate and the second carrier substrate 200 is a dual layered package substrate. In those cases, the first carrier substrate 100 may include an insulating layer 102 and conductive traces 101 and 105 that are electrically coupled from each other through conductive vias 103. The conductive traces 101 and 105 are respectively disposed on the bottom and top surfaces of the insulating layer 102 (i.e., the second surface 100b and the first surface 100a of the first carrier substrate 100) and the conductive vias 103 are disposed in the insulating layer 102. Moreover, the second carrier substrate 200 may include insulating layers 202 and 204 and conductive traces 201, 205 and 209 that are electrically coupled from each other through conductive vias 203 and 207. For example, the conductive traces 201 are disposed on the bottom surface of the insulating layer 202 (i.e., the second surface 200b of the second carrier substrate 200). The conductive traces 209 are disposed on the top surface of the insulating layer 204 (i.e., the first surface 200a of the second carrier substrate 200). The conductive traces 205 are disposed on the top surface of the insulating layer 202 or the bottom surface of the insulating layer 204. Moreover, conductive vias 203 are disposed in the insulating layer 202 between the conductive traces 201 and 205. Moreover, conductive vias 207 are disposed in the insulating layer 204 between the conductive traces 205 and 209. In some embodiments, the insulating layers 102, 202 and 204 may be formed of organic materials, which include a polymer base material (e.g., PP, PBO or polyimide), or the like.

In some embodiments, the second carrier substrate 200 is electrically coupled to the first carrier substrate 100 via conductive structures 210 (such as solder balls). Moreover, the second carrier substrate 200 is electrically coupled to the semiconductor die 300 via conductive structures 310 (such as solder bumps).

In some embodiments, the semiconductor die 300 (such as a system-on-chip (SOC) die) may include a logic die including a central processing unit (CPU), a graphics processing unit (GPU), a dynamic random access memory (DRAM) controller or any combination thereof. Alternatively, the semiconductor die 300 may include a modem die.

In some embodiments, the semiconductor package structure 10a further includes a heat spreader 415 disposed on the first surface 100a of the first carrier substrate 100 so as to form a cavity therebetween. For example, the heat spreader 415 is fixed on the first surface 100a of the first carrier substrate 100 via an adhesive layer 412 (such as a thermal interface adhesive (TIA) layer). The heat spreader 415 covers and surrounds the second carrier substrate 200 and the semiconductor die 300 which are in the cavity. Moreover, a thermal interface material (TIM) layer 410 may be adhered between the semiconductor die 300 and the heat spreader 415. As a result, the heat generated from the semiconductor die 300 can be conducted to the heat spreader 415 through the TIM layer 410 and through the second carrier substrate 200, the first carrier substrate 100 and the adhesive layer 412.

In some embodiments, the first semiconductor package of the semiconductor package structure 10a further includes an encapsulating material 420 having a first portion 420a and a second portion 420b. The first portion 420a of the encapsulating material 420 may be covered by the heat spreader 415, so that the second carrier substrate 200 and the semiconductor die 300 are surrounded by the first portion 420a of the encapsulating material 420. Also, the gap between the semiconductor die 300 and the second carrier substrate 200 and the gap between the second carrier substrate 200 and the first carrier substrate 100 are filled with the first portion 420a of the encapsulating material 420. Moreover, the second portion 420b of the encapsulating material 420 surrounds an exterior sidewall 415a of the heat spreader 415 and exposes a portion of the heat spreader 415 that covers the first portion 420a of the encapsulating material 420 and the semiconductor die 300. Alternatively, the formed encapsulating material 420 is merely covered by the heat spreader 415 without surrounding the exterior sidewall 415a of the heat spreader 415.

In some embodiments, the encapsulating material 420 may be a molding compound that is formed of an epoxy, a resin, a moldable polymer, or the like. The encapsulating material 420 may be applied while substantially liquid, and then may be cured through a chemical reaction, such as in an epoxy or resin. In some other embodiments, the encapsulating material 420 may be an ultraviolet (UV) or thermally cured polymer applied as a gel or malleable solid capable of being disposed around the heat spreader 415 and in the cavity created by the heat spreader 415 and the first carrier substrate 100, and then may be cured through a UV or thermal curing process. The encapsulating material 420 may be cured with a mold (not shown). In some embodiments, the heat generated from the semiconductor die 300 can also be conducted to the heat spreader 415 through the encapsulating material 420.

In some embodiments, the semiconductor package structure 10a further includes one or more passive devices 220, such as capacitors, mounted on the second surface 200b of the second carrier substrate 200 and directly below the semiconductor die 300. In order to simplify the diagram, only one passive device is depicted. The passive device 220 is surrounded and supported by the encapsulating material 420. As a result, the passive device 220 can be prevented from falling off after performing a thermal process, such as a reflow process.

Figures 1, 1E:
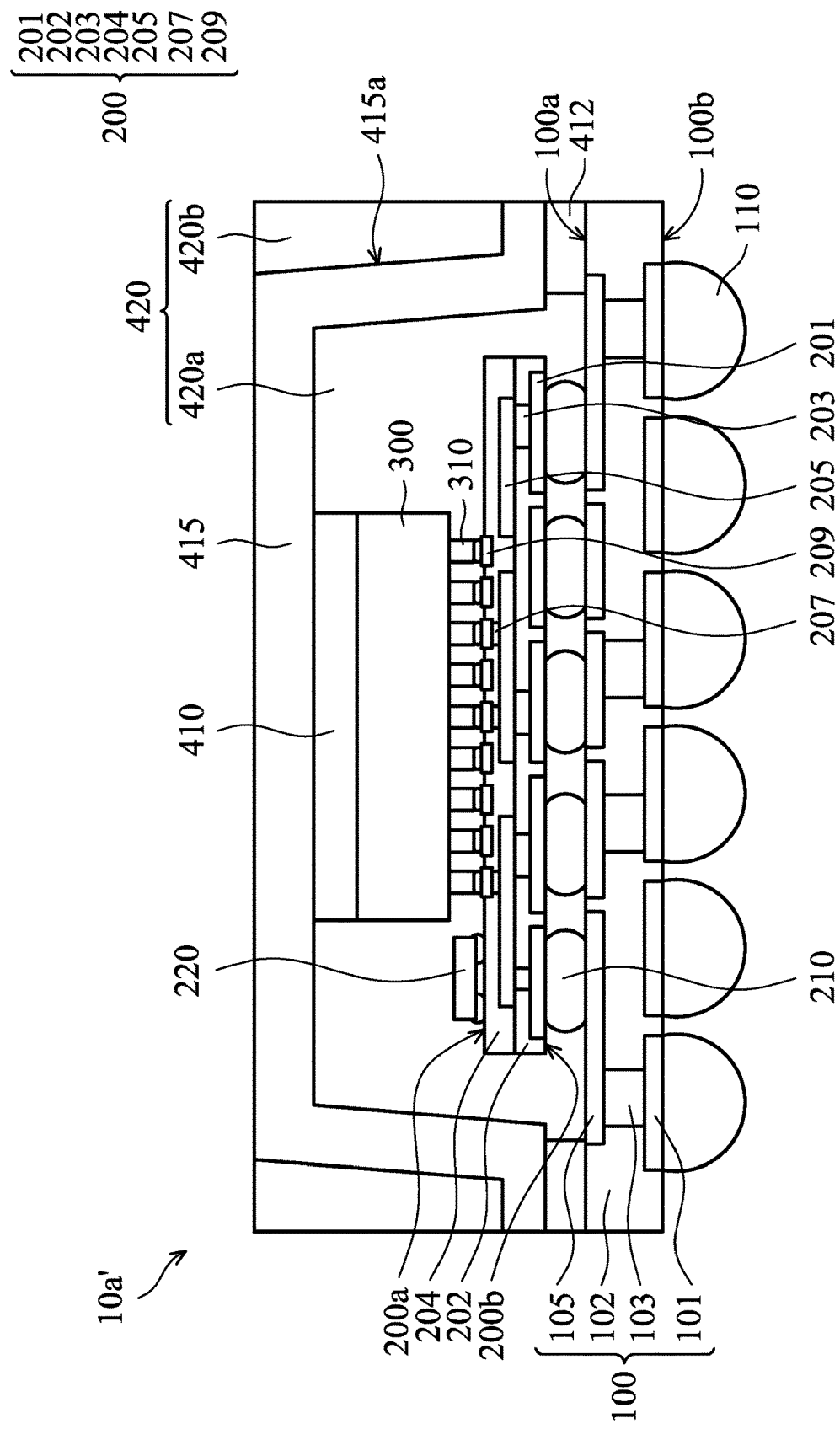
Figures 1, 1E, 2:
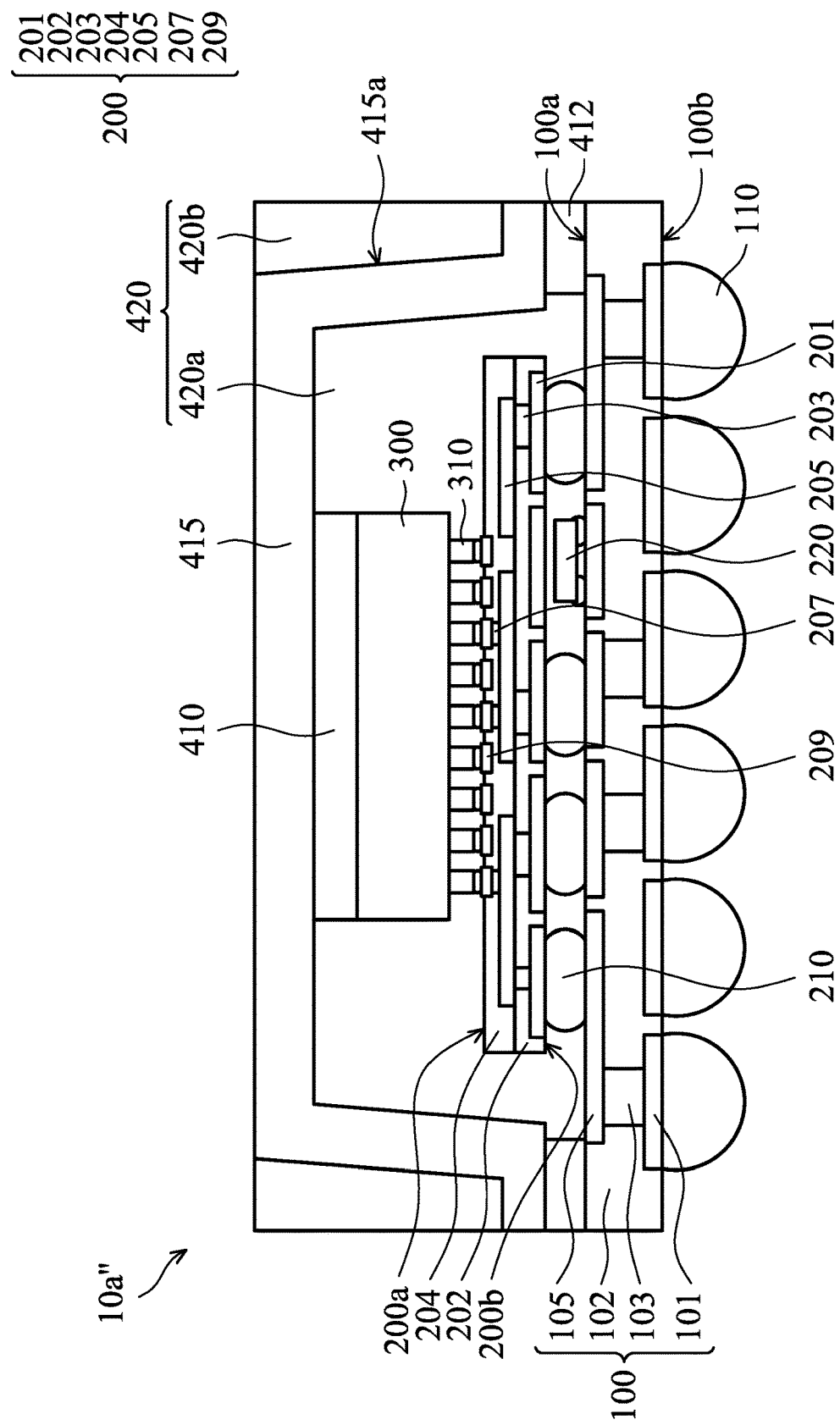

Alternatively, the passive device 220 may be mounted on the first surface 200a of the second carrier substrate 200 and near the edge of the second carrier substrate 200, as shown in FIG. 1E-1. In some other embodiments, the passive device 220 is mounted on the first surface 100a of the first carrier substrate 100 and directly below the semiconductor die 300, as shown in FIG. 1E-2. Alternatively, the passive device 220 mounted on the first surface 100a of the first carrier substrate 100 may be near the edge of the first carrier substrate 100.

Figure 2A:
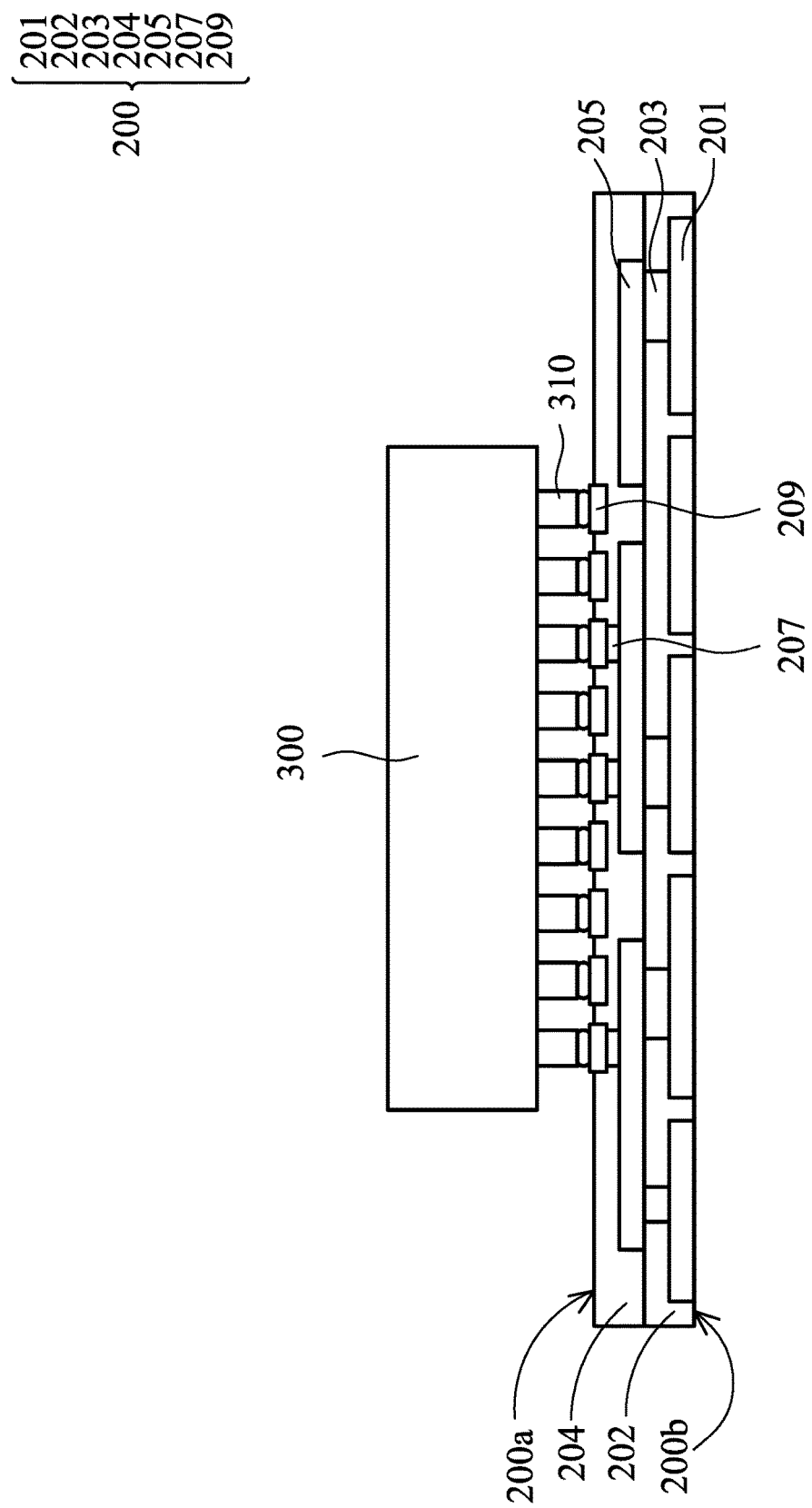
FIGS. 2A to 2F are cross-sectional views of various stages of a method for forming a semiconductor package structure, in accordance with some embodiments of the disclosure.
Figure 2B:
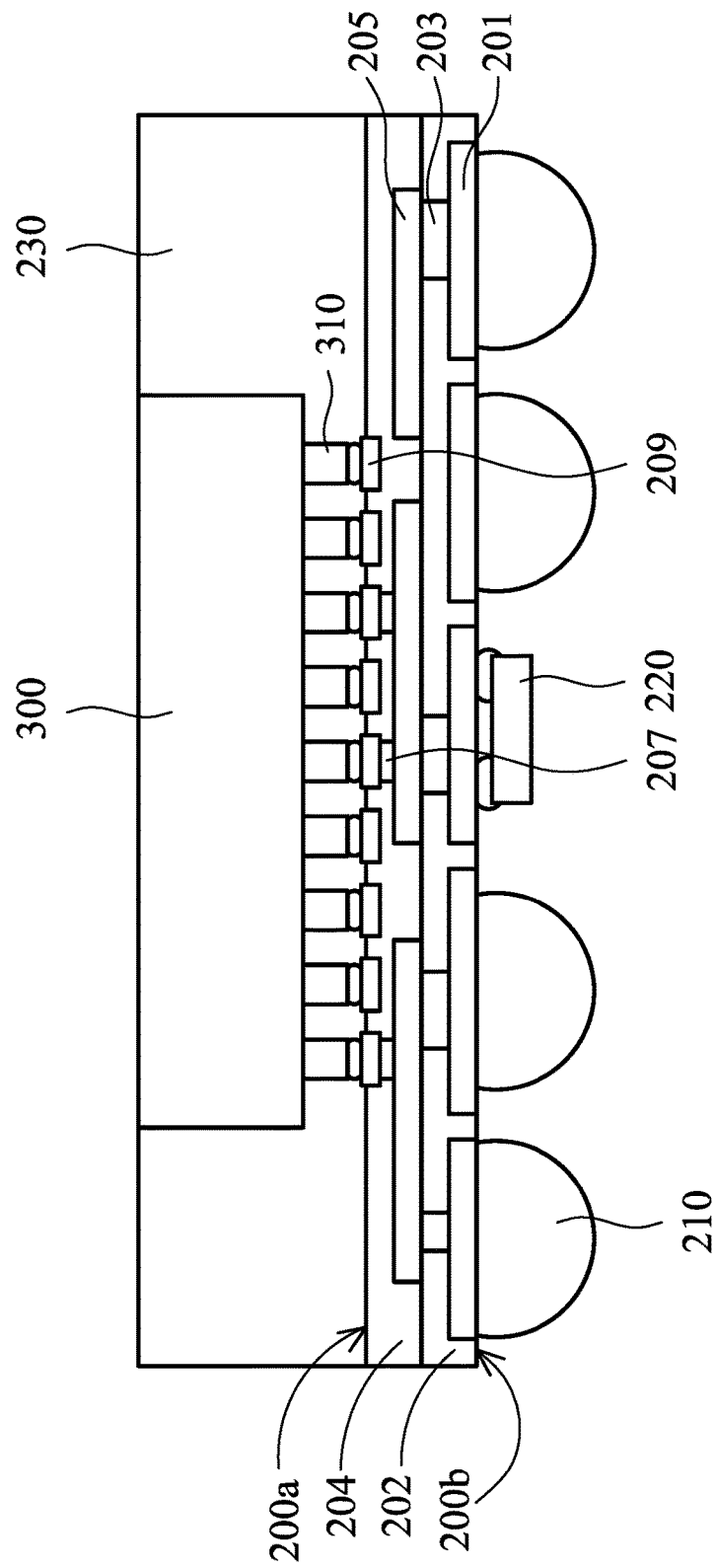
Figure 2C:
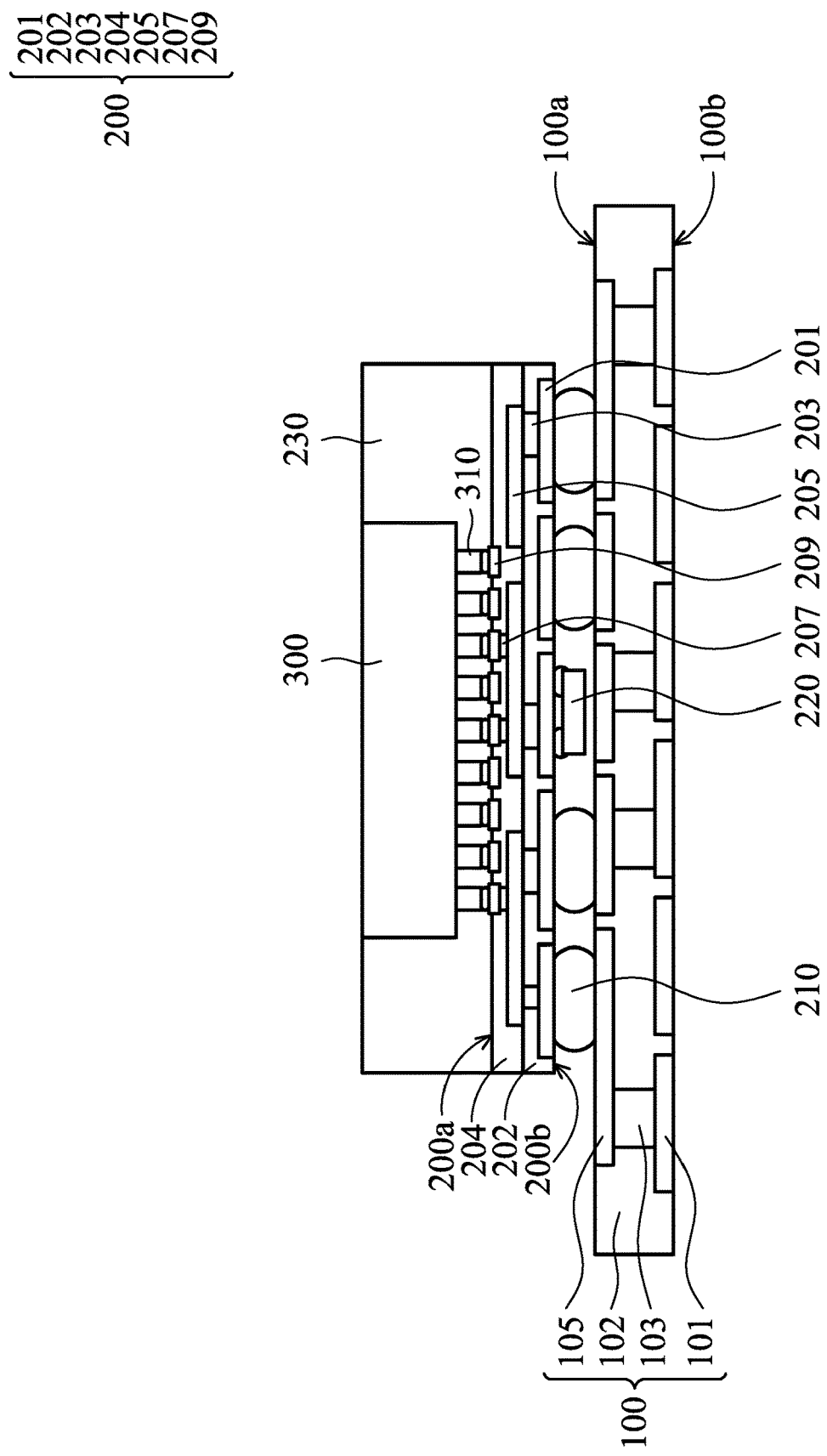
Figure 2D:
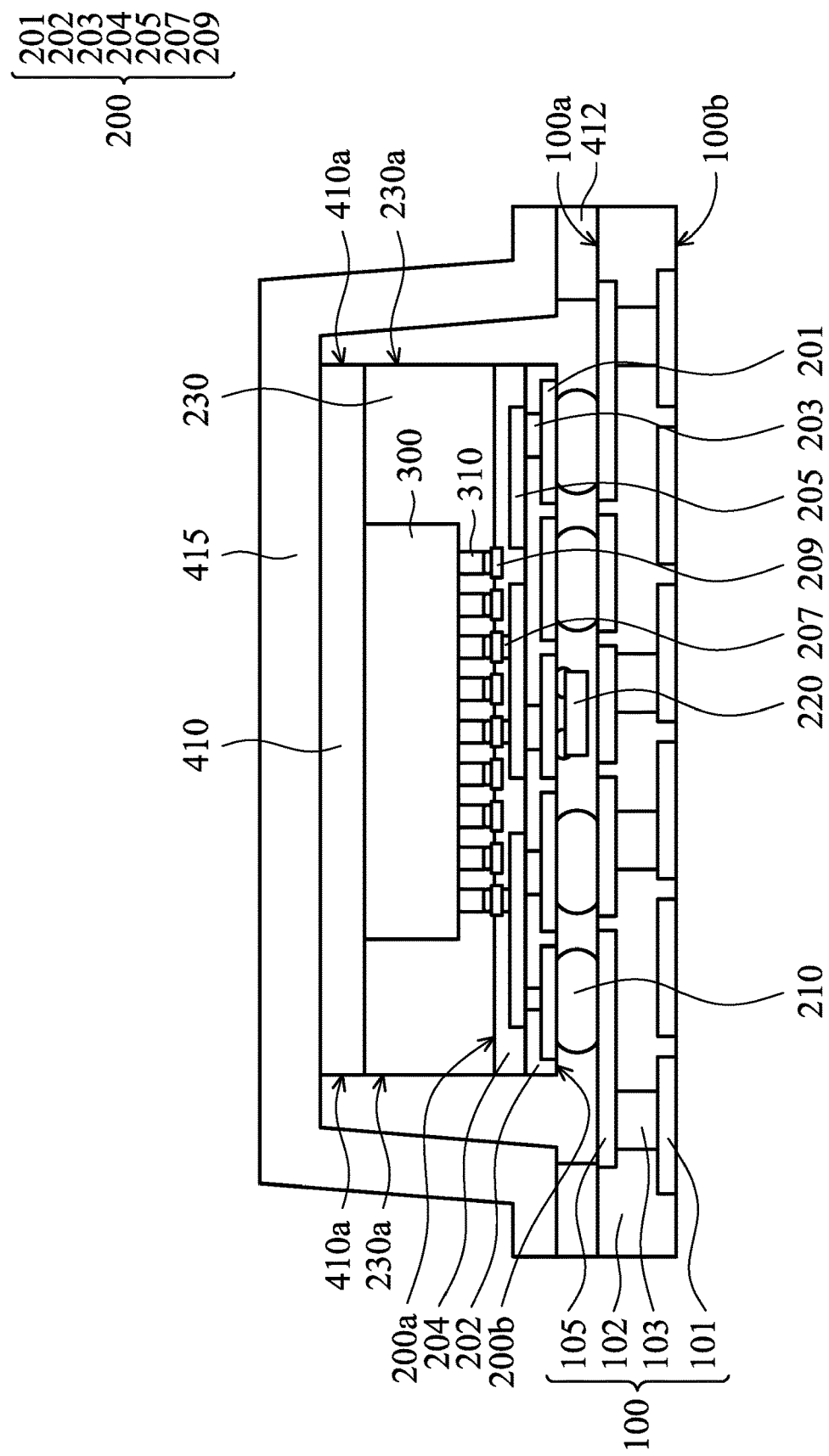
Figure 2E:
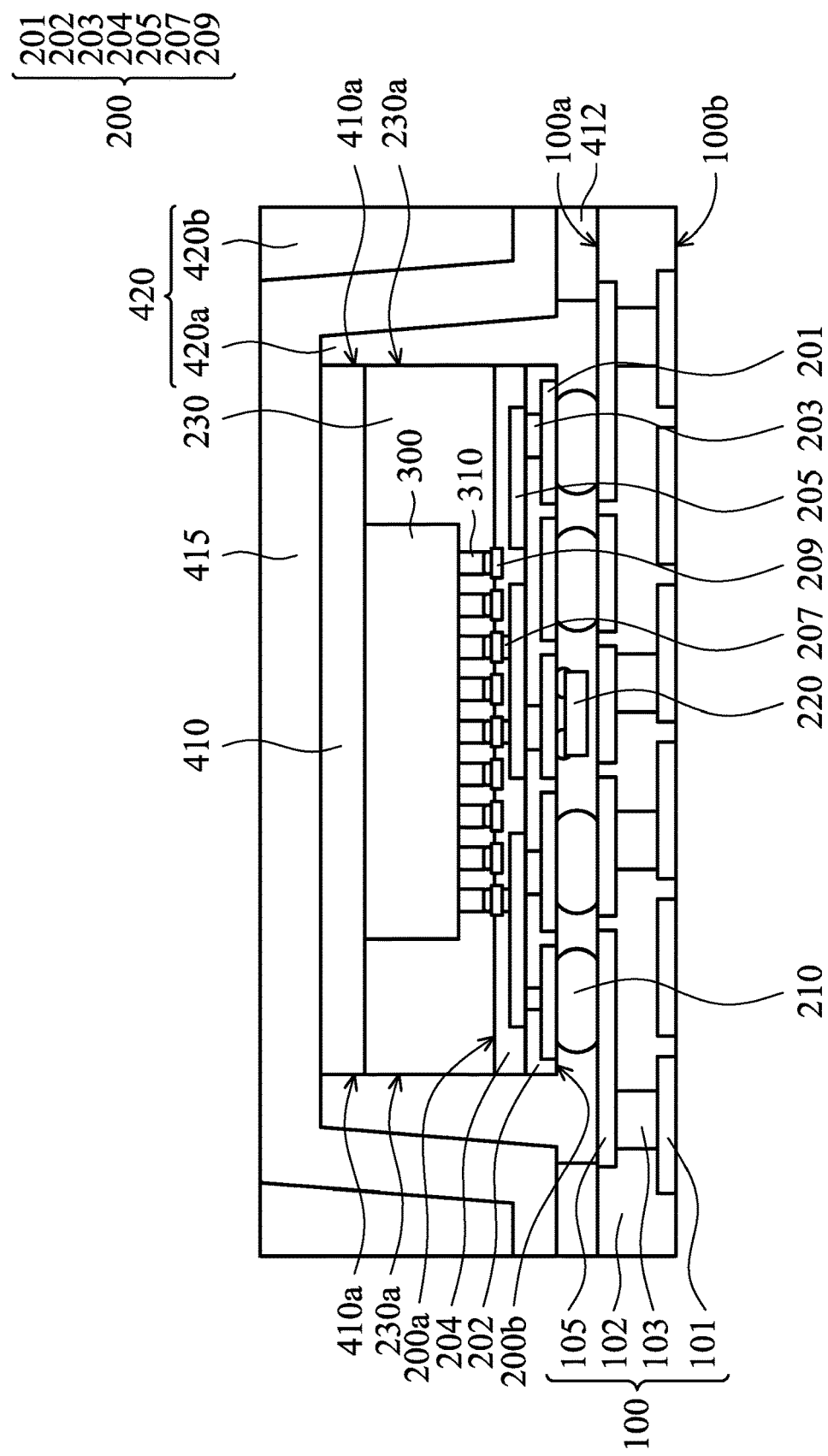
Figure 2F:
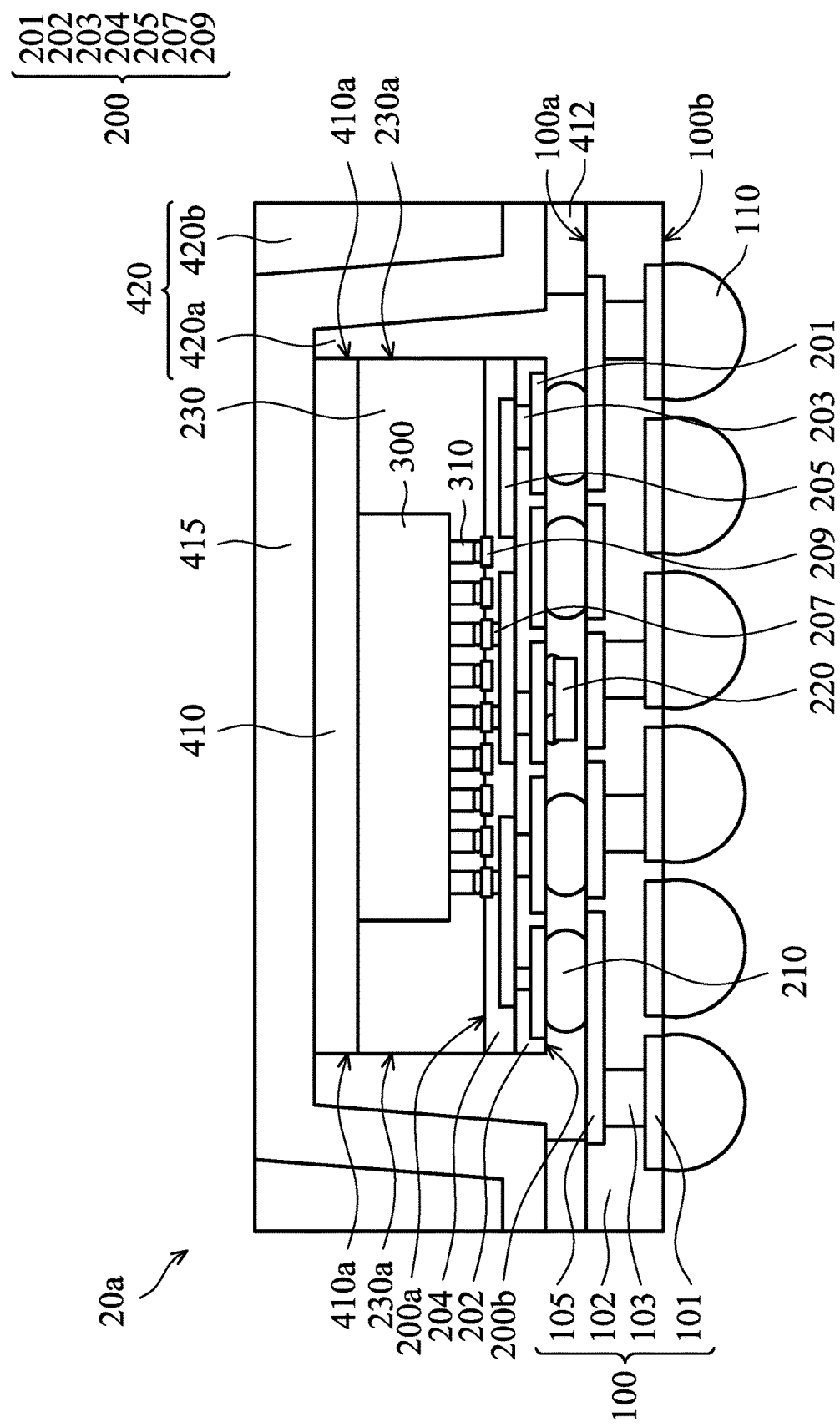

FIG. 2F is a cross-sectional view of a semiconductor package structure 20a in accordance with some embodiments of the disclosure. Descriptions of elements of the embodiments hereinafter that are the same as or similar to those previously described with reference to FIG. 1E may be omitted for brevity. In the embodiment, the semiconductor package structure 20a is similar to the semiconductor package structure 10a shown in FIG. 1E. As shown in FIG. 2F, unlike the semiconductor package structure 10a, the semiconductor package structure 20a includes an encapsulating material 230 disposed on the first surface 200a of the second carrier substrate 200 and surrounding the semiconductor die 300. The encapsulating material 230 is surrounded by the first portion 420a of the encapsulating material 420. Also, the encapsulating material 230 is surrounded and covered by the hear spreader 415.

Moreover, unlike the semiconductor package structure 10a, an edge of the TIM layer 410 in the semiconductor package structure 20a is substantially aligned to an edge of the encapsulating material 230. Alternatively, the edge of the TIM layer 410 may be substantially aligned to an edge of the semiconductor die 300.

In some embodiments, the passive device 220 may be mounted on the first surface 200a of the second carrier substrate 200 and near the edge of the second carrier substrate 200, as the arrangement of the passive device 220 shown in FIG. 1E-1. In some other embodiments, the passive device 220 may be mounted on the first surface 100a of the first carrier substrate 100 and directly below the semiconductor die 300, as the arrangement of the passive device 220 shown in FIG. 1E-2. Alternatively, the passive device 220 mounted on the first surface 100a of the first carrier substrate 100 may be near the edge of the first carrier substrate 100.

Figure 3:
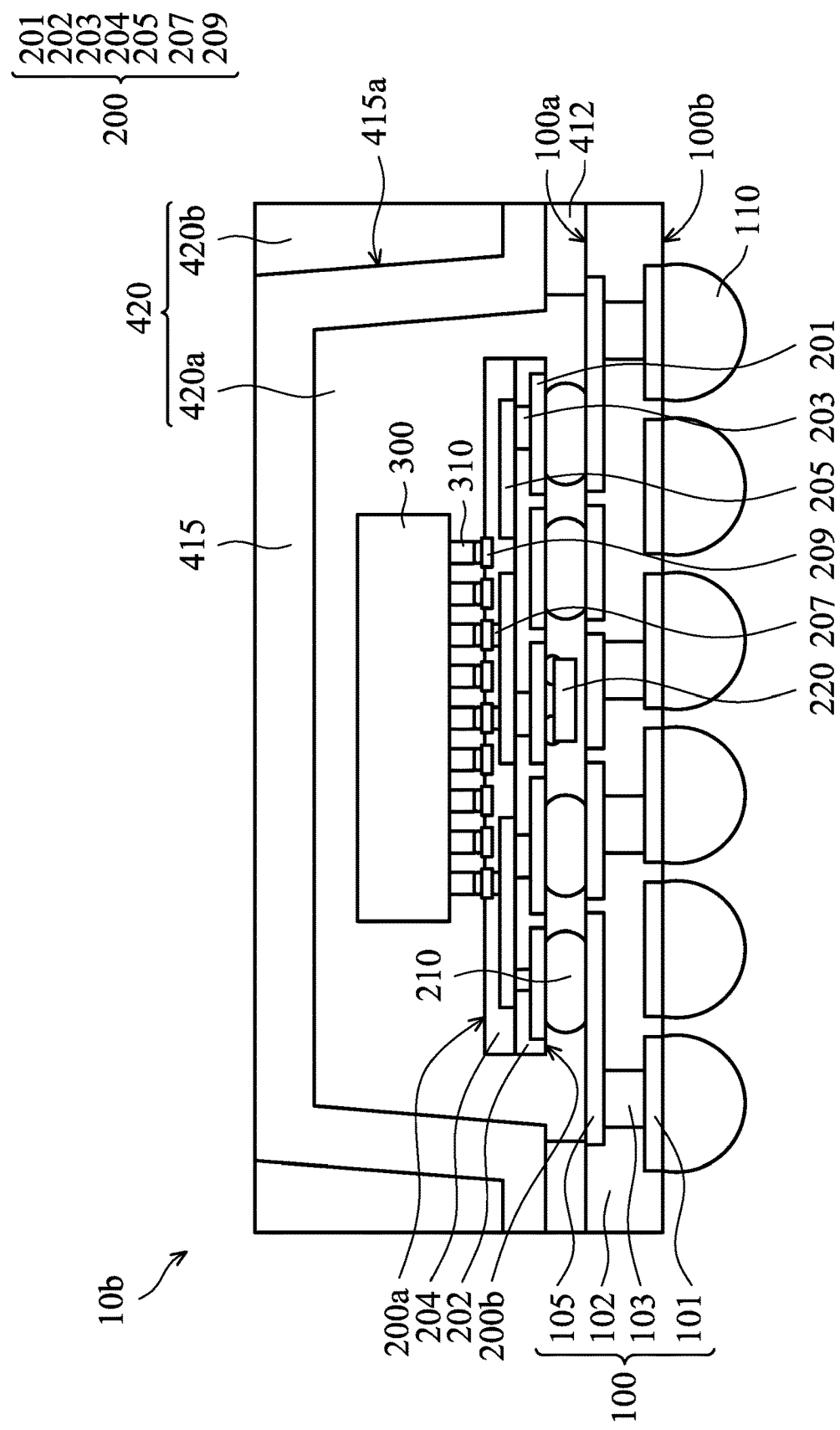
FIG. 3 is a cross-sectional view of a semiconductor package structure in accordance with some embodiments of the disclosure.

FIG. 3 is a cross-sectional view of a semiconductor package structure 10b in accordance with some embodiments of the disclosure. Descriptions of elements of the embodiments hereinafter that are the same as or similar to those previously described with reference to FIG. 1E may be omitted for brevity. In the embodiment, the semiconductor package structure 10b is similar to the semiconductor package structure 10a shown in FIG. 1E. As shown in FIG. 3, unlike the semiconductor package structure 10a, the semiconductor package structure 10b does not have a TIM layer 410 interposed between the heat spreader 415 and the semiconductor die 300. In the embodiment, the first portion of encapsulating material 420 is interposed between the heat spreader 415 and the semiconductor die 300 to cover an upper surface of the semiconductor die 300.

Figure 4:
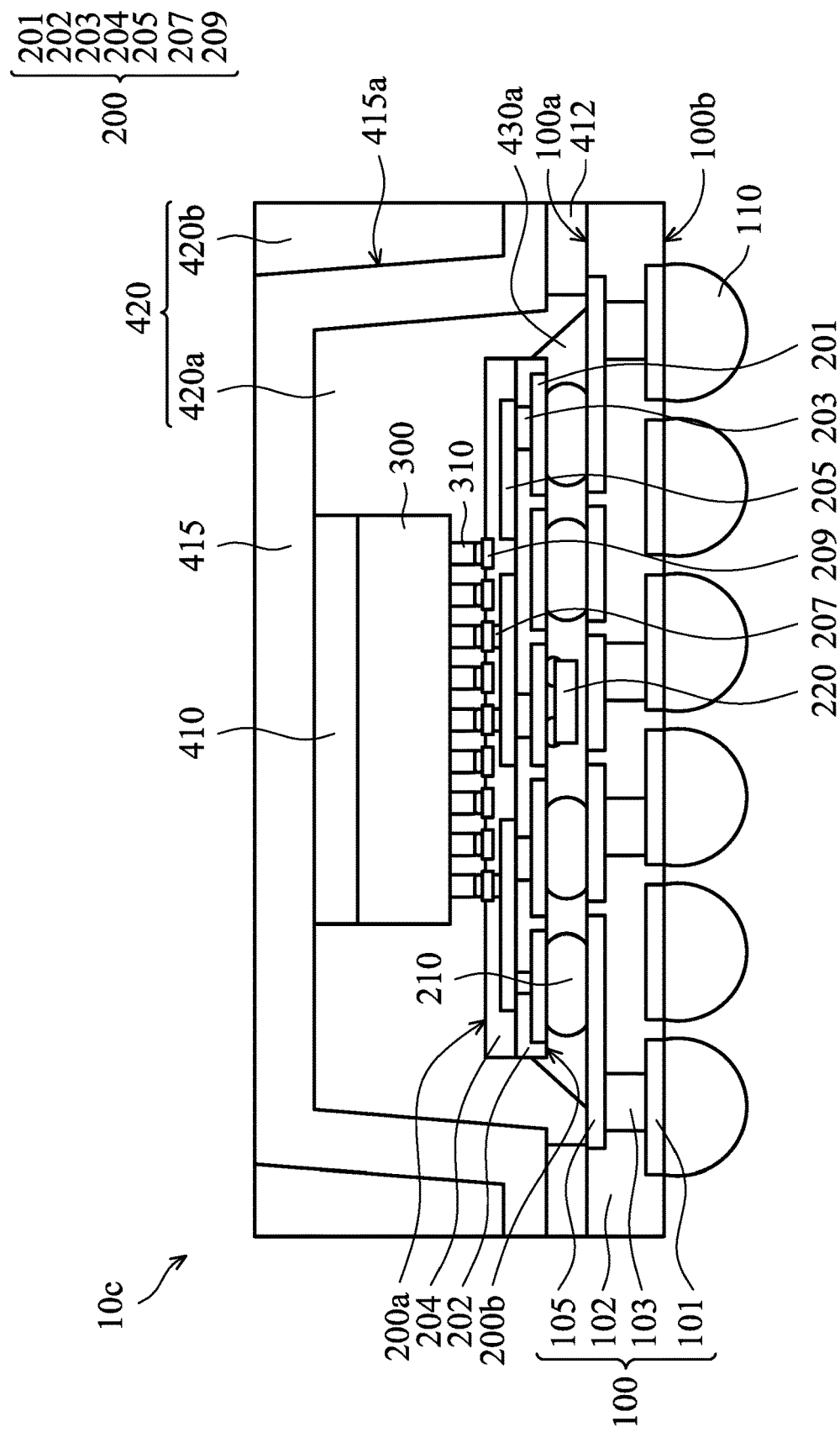
FIG. 4 is a cross-sectional view of a semiconductor package structure in accordance with some embodiments of the disclosure.

FIG. 4 is a cross-sectional view of a semiconductor package structure 10c in accordance with some embodiments of the disclosure. Descriptions of elements of the embodiments hereinafter that are the same as or similar to those previously described with reference to FIG. 1E may be omitted for brevity. In the embodiment, the semiconductor package structure 10c is similar to the semiconductor package structure 10a shown in FIG. 1E. As shown in FIG. 4, unlike the semiconductor package structure 10a, the semiconductor package structure 10c includes an underfill material layer 430a interposed between the first carrier substrate 100 and the second carrier substrate 200, so that the conductive structures 210 and the passive device 220 are surrounded by the underfill material layer 430a.

Figure 5:
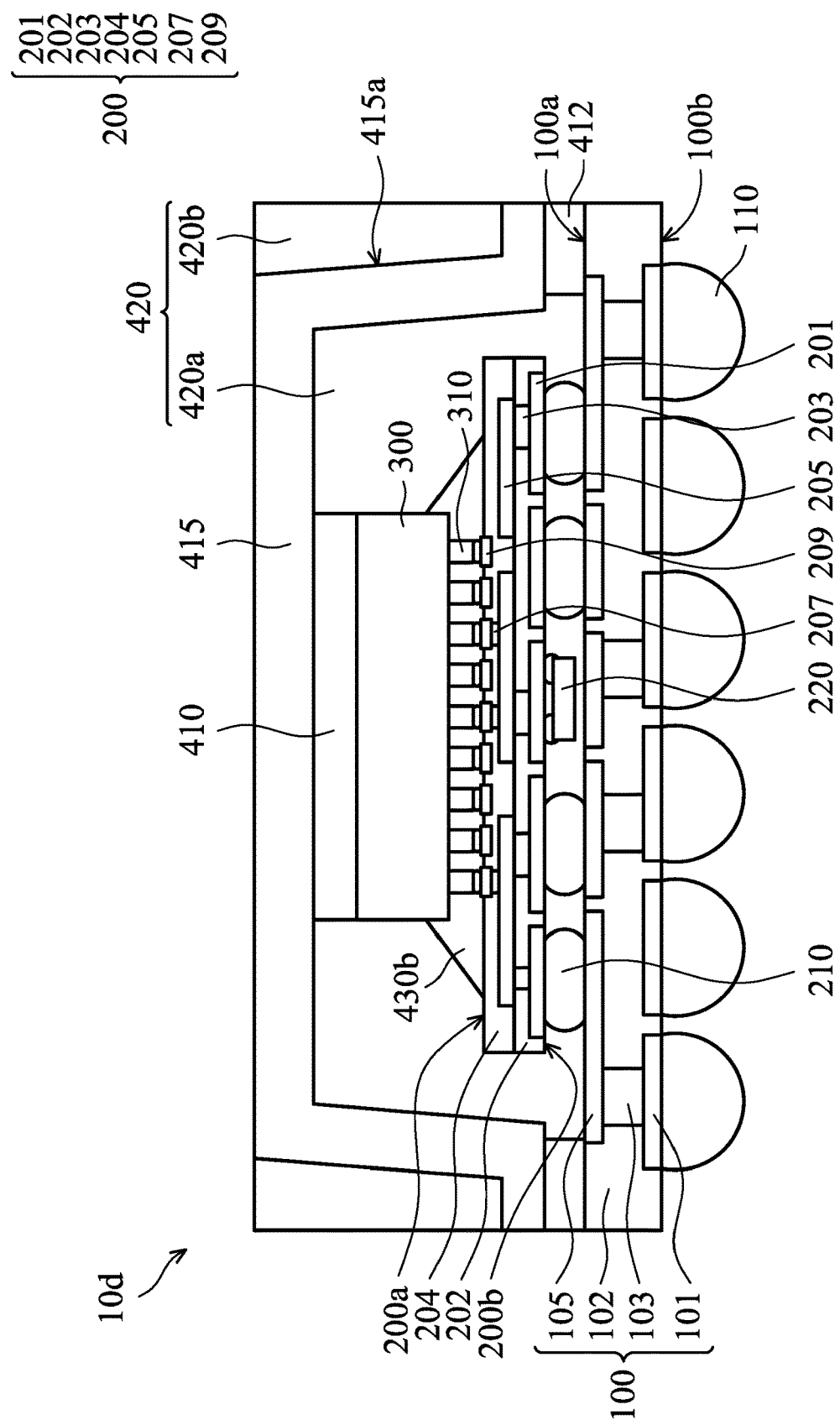
FIG. 5 is a cross-sectional view of a semiconductor package structure in accordance with some embodiments of the disclosure.

FIG. 5 is a cross-sectional view of a semiconductor package structure 10d in accordance with some embodiments of the disclosure. Descriptions of elements of the embodiments hereinafter that are the same as or similar to those previously described with reference to FIG. 1E may be omitted for brevity. In the embodiment, the semiconductor package structure 10d is similar to the semiconductor package structure 10a shown in FIG. 1E. As shown in FIG. 5, unlike the semiconductor package structure 10a, the semiconductor package structure 10d includes an underfill material layer 430b interposed between the semiconductor die 300 and the second carrier substrate 200, so that the conductive structures 310 are surrounded by the underfill material layer 430b.

Figure 6:
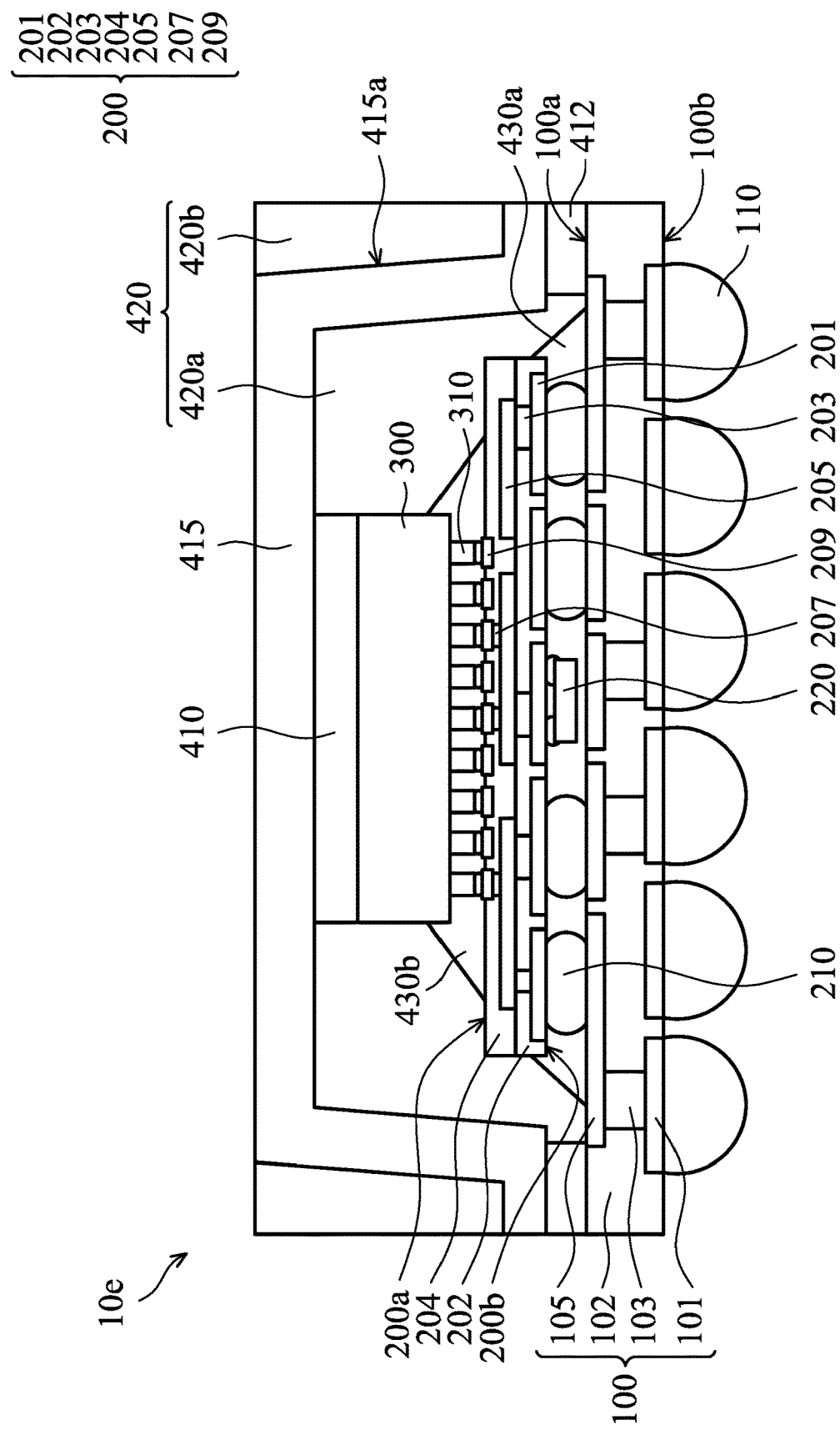
FIG. 6 is a cross-sectional view of a semiconductor package structure in accordance with some embodiments of the disclosure.

FIG. 6 is a cross-sectional view of a semiconductor package structure 10e in accordance with some embodiments of the disclosure. Descriptions of elements of the embodiments hereinafter that are the same as or similar to those previously described with reference to FIG. 1E may be omitted for brevity. In the embodiment, the semiconductor package structure 10e is similar to the semiconductor package structure 10a shown in FIG. 1E. As shown in FIG. 6, unlike the semiconductor package structure 10a, the semiconductor package structure 10e includes an underfill material layer 430a interposed between the first carrier substrate 100 and the second carrier substrate 200 and an underfill material layer 430b interposed between the semiconductor die 300 and the second carrier substrate 200, so that the conductive structures 210 and the passive device 220 are surrounded by the underfill material layer 430b and the conductive structures 310 are surrounded by the underfill material layer 430a.

Figure 7:
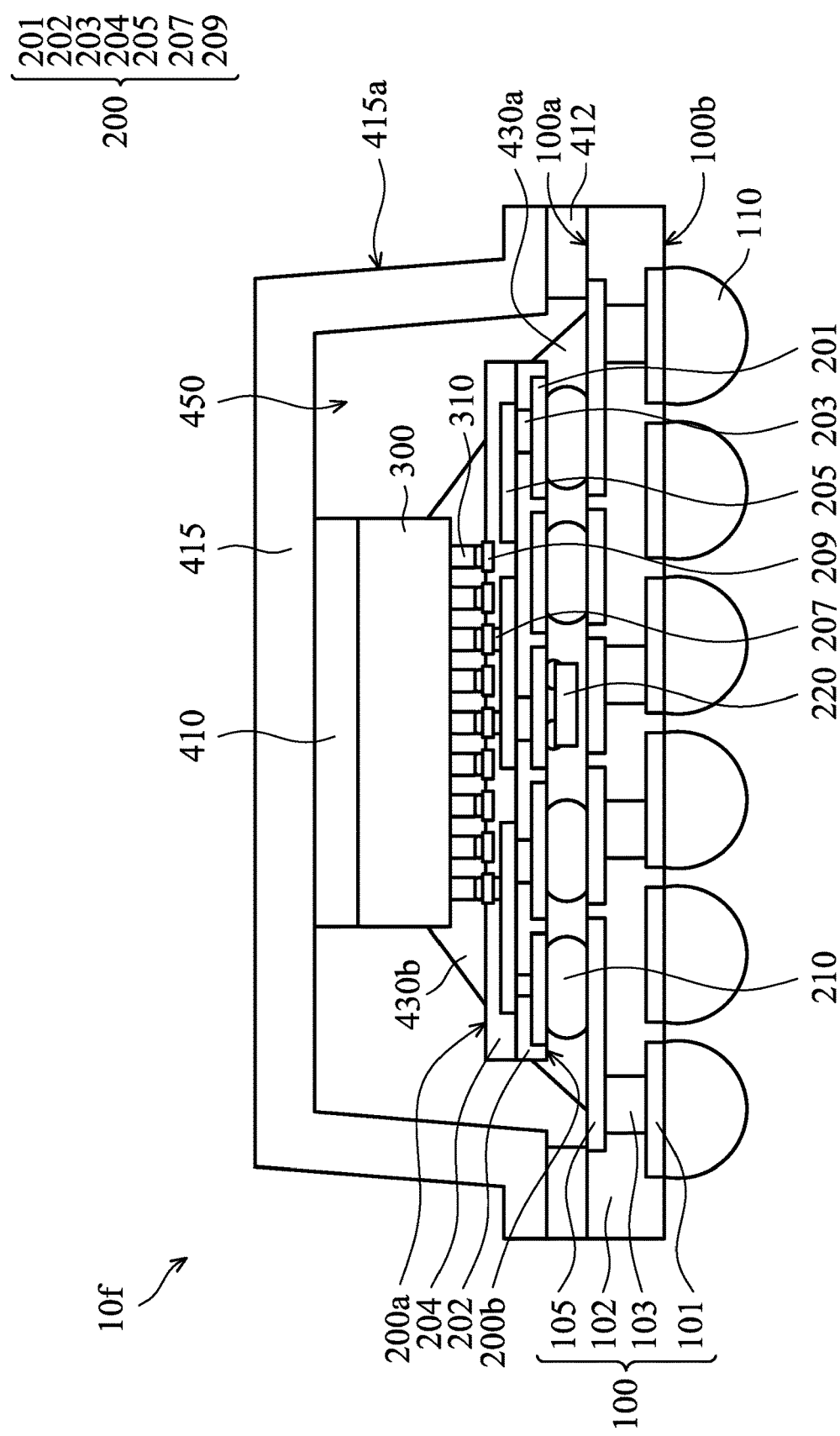
FIG. 7 is a cross-sectional view of a semiconductor package structure in accordance with some embodiments of the disclosure.

FIG. 7 is a cross-sectional view of a semiconductor package structure 10f in accordance with some embodiments of the disclosure. Descriptions of elements of the embodiments hereinafter that are the same as or similar to those previously described with reference to FIG. 6 may be omitted for brevity. In the embodiment, the semiconductor package structure 10f is similar to the semiconductor package structure 10e shown in FIG. 6. As shown in FIG. 7, unlike the semiconductor package structure 10e, the semiconductor package structure 10f does not have an encapsulating material 420. Accordingly, a gap 450 surrounding the TIM layer 410, the semiconductor die 300, the second carrier substrate 200, and the underfill material layers 430a and 430b is formed.

Figure 8:
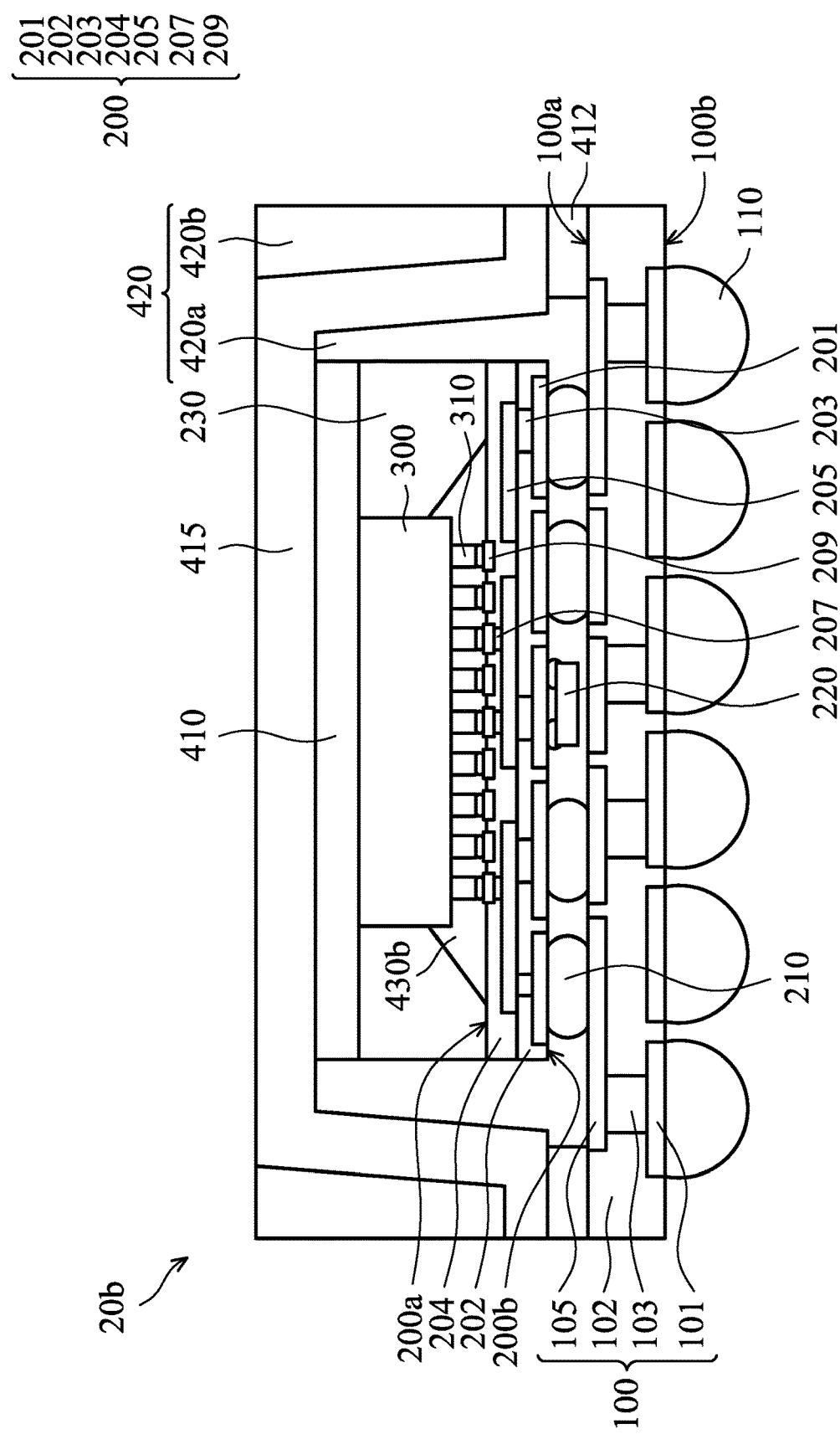
FIG. 8 is a cross-sectional view of a semiconductor package structure in accordance with some embodiments of the disclosure.

FIG. 8 is a cross-sectional view of a semiconductor package structure 20b in accordance with some embodiments of the disclosure. Descriptions of elements of the embodiments hereinafter that are the same as or similar to those previously described with reference to FIG. 2F may be omitted for brevity. In the embodiment, the semiconductor package structure 20b is similar to the semiconductor package structure 20a shown in FIG. 2F. As shown in FIG. 8, unlike the semiconductor package structure 20a, the semiconductor package structure 20b includes an underfill material layer 430b interposed between the semiconductor die 300 and the second carrier substrate 200 and surrounded by the encapsulating material 230, so that the conductive structures 310 are surrounded by the underfill material layer 430b.

Figure 9:
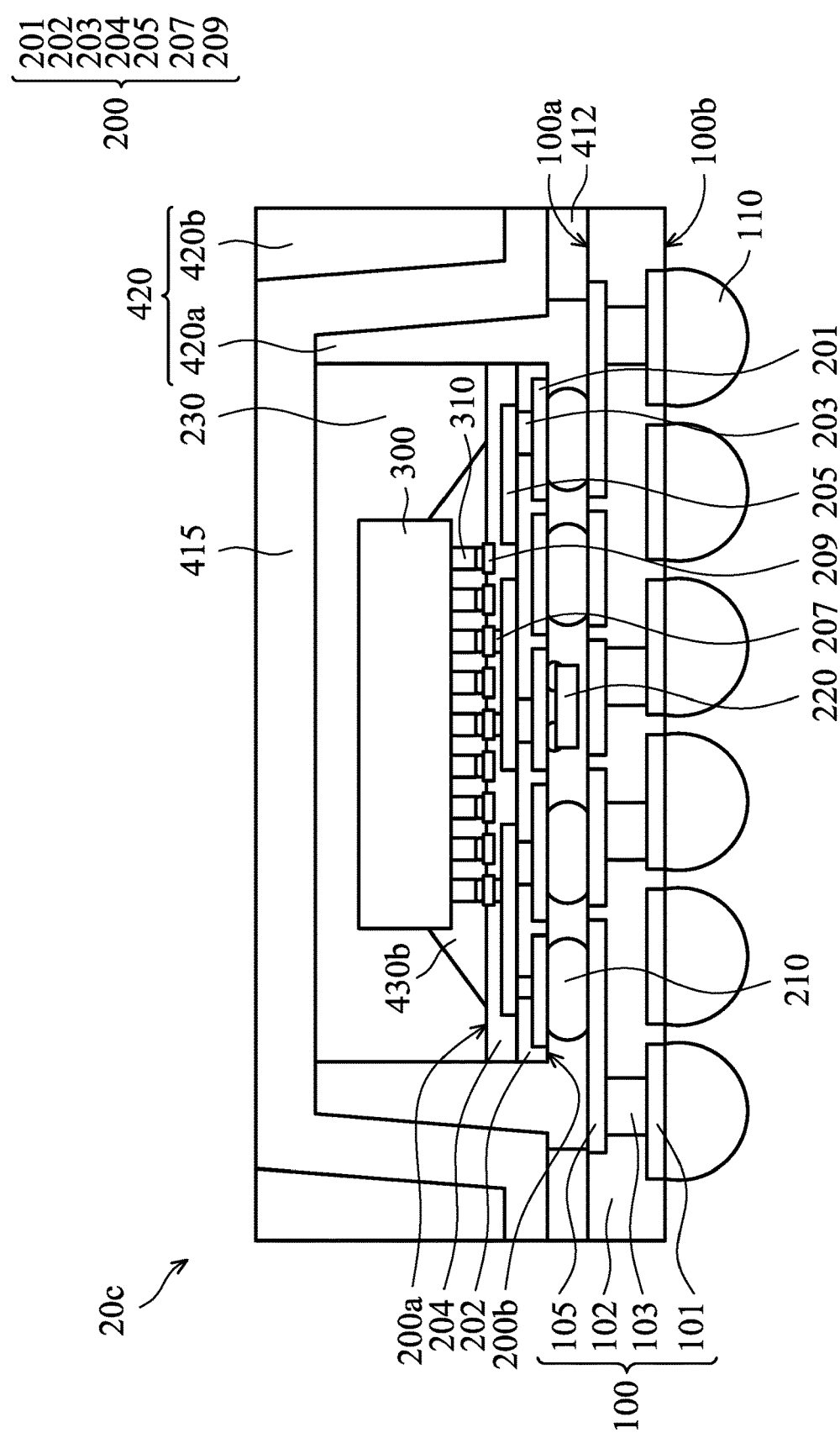
FIG. 9 is a cross-sectional view of a semiconductor package structure in accordance with some embodiments of the disclosure.

FIG. 9 is a cross-sectional view of a semiconductor package structure 20c in accordance with some embodiments of the disclosure. Descriptions of elements of the embodiments hereinafter that are the same as or similar to those previously described with reference to FIG. 8 may be omitted for brevity. In the embodiment, the semiconductor package structure 20c is similar to the semiconductor package structure 20b shown in FIG. 8. As shown in FIG. 9, unlike the semiconductor package structure 20b, the semiconductor package structure 20c does not have a TIM layer 410 interposed between the heat spreader 415 and the semiconductor die 300. In the embodiment, the encapsulating material 230 is interposed between the heat spreader 415 and the semiconductor die 300 to cover the upper surface of the semiconductor die 300.

Figure 10:
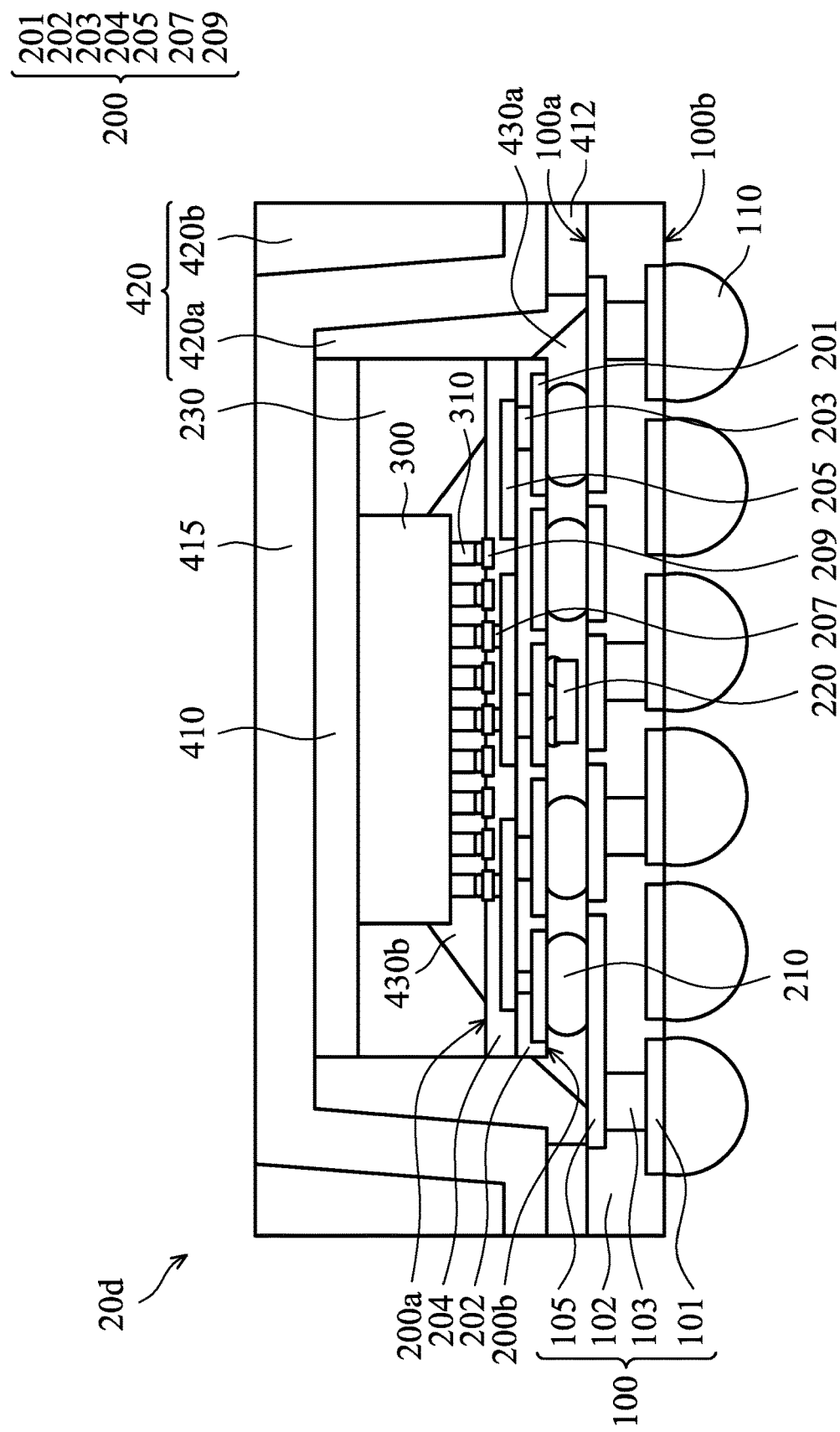
FIG. 10 is a cross-sectional view of a semiconductor package structure in accordance with some embodiments of the disclosure.

FIG. 10 is a cross-sectional view of a semiconductor package structure 20d in accordance with some embodiments of the disclosure. Descriptions of elements of the embodiments hereinafter that are the same as or similar to those previously described with reference to FIG. 8 may be omitted for brevity. In the embodiment, the semiconductor package structure 20d is similar to the semiconductor package structure 20b shown in FIG. 8. As shown in FIG. 10, unlike the semiconductor package structure 20b, the semiconductor package structure 20d includes an underfill material layer 430a interposed between the first carrier substrate 100 and the second carrier substrate 200 and surrounded by the first portion 420a of the encapsulating material 420.

Figure 11:
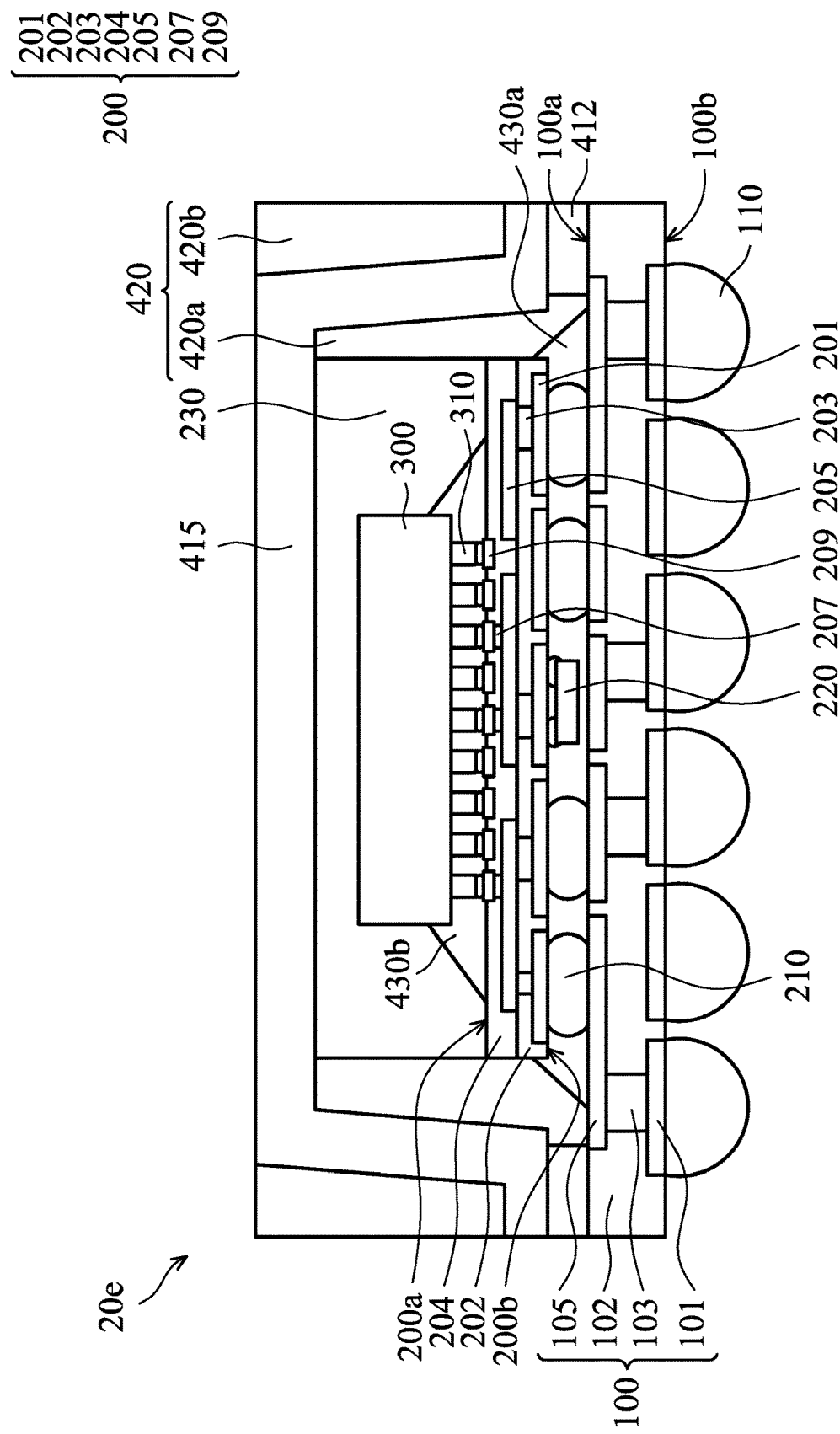
FIG. 11 is a cross-sectional view of a semiconductor package structure in accordance with some embodiments of the disclosure.

FIG. 11 is a cross-sectional view of a semiconductor package structure 20e in accordance with some embodiments of the disclosure. Descriptions of elements of the embodiments hereinafter that are the same as or similar to those previously described with reference to FIG. 9 may be omitted for brevity. In the embodiment, the semiconductor package structure 20e is similar to the semiconductor package structure 20c shown in FIG. 9. As shown in FIG. 11, unlike the semiconductor package structure 20c, the semiconductor package structure 20e includes an underfill material layer 430a interposed between the first carrier substrate 100 and the second carrier substrate 200 and surrounded by the first portion 420a of the encapsulating material 420.

Figure 12:
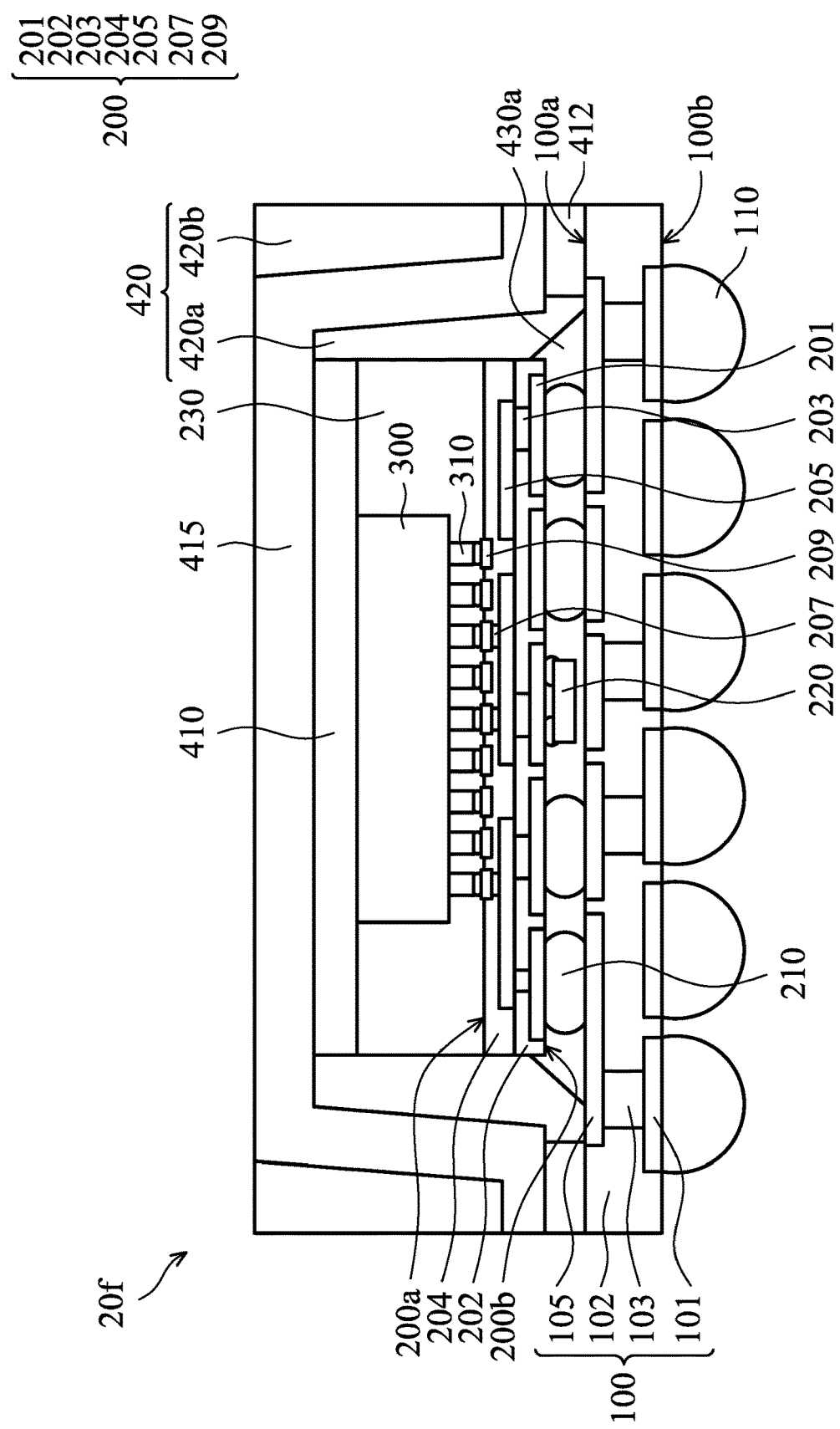
FIG. 12 is a cross-sectional view of a semiconductor package structure in accordance with some embodiments of the disclosure.

FIG. 12 is a cross-sectional view of a semiconductor package structure 20f in accordance with some embodiments of the disclosure. Descriptions of elements of the embodiments hereinafter that are the same as or similar to those previously described with reference to FIG. 2F may be omitted for brevity. In the embodiment, the semiconductor package structure 20f is similar to the semiconductor package structure 20a shown in FIG. 2F. As shown in FIG. 12, unlike the semiconductor package structure 20a, the semiconductor package structure 20f includes an underfill material layer 430a interposed between the first carrier substrate 100 and the second carrier substrate 200 and surrounded by the first portion 420a of the encapsulating material 420.

Figure 13:
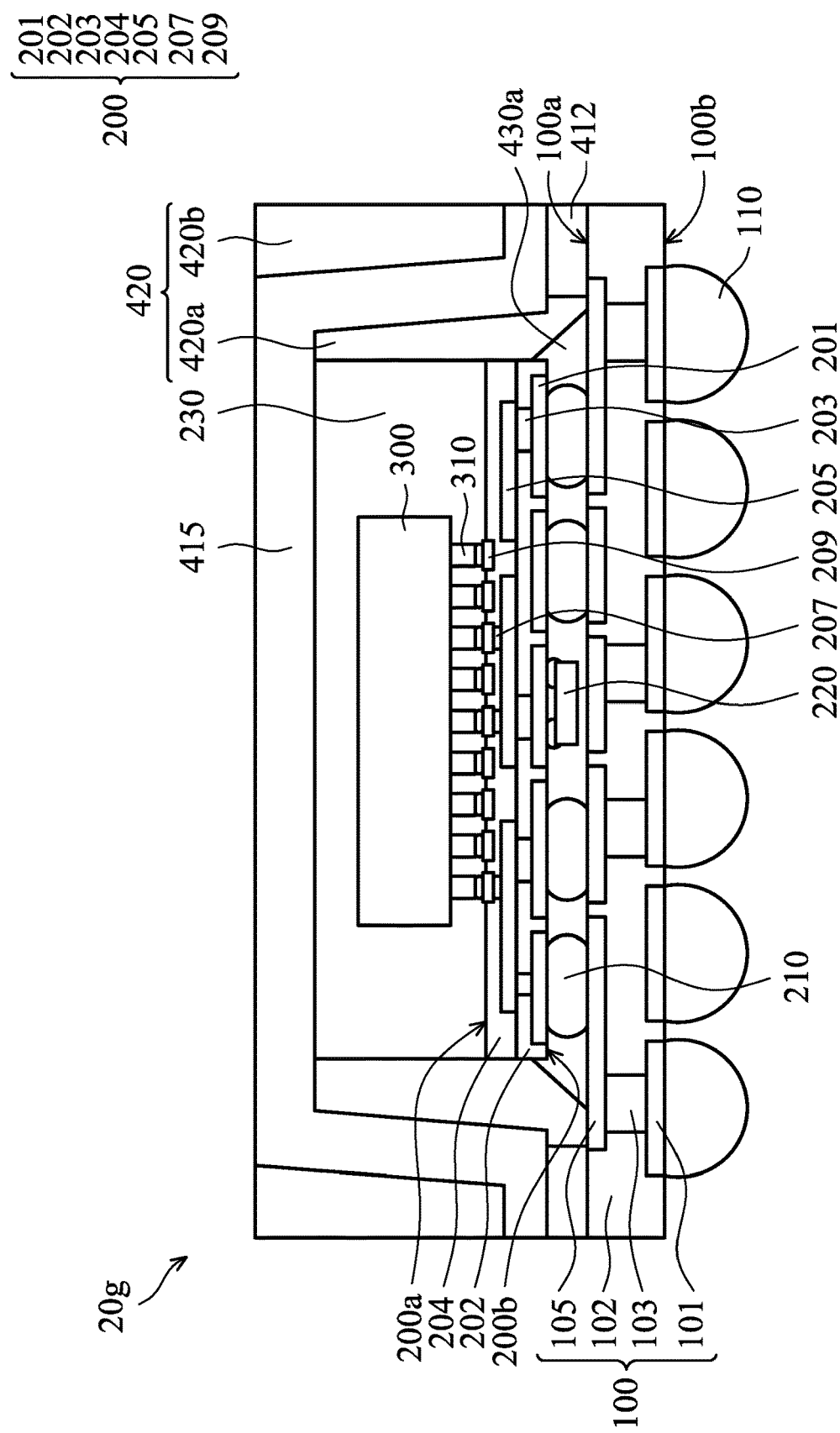
FIG. 13 is a cross-sectional view of a semiconductor package structure in accordance with some embodiments of the disclosure.

FIG. 13 is a cross-sectional view of a semiconductor package structure 20g in accordance with some embodiments of the disclosure. Descriptions of elements of the embodiments hereinafter that are the same as or similar to those previously described with reference to FIG. 2F may be omitted for brevity. In the embodiment, the semiconductor package structure 20g is similar to the semiconductor package structure 20a shown in FIG. 2F. As shown in FIG. 13, unlike the semiconductor package structure 20a, the semiconductor package structure 20g includes an underfill material layer 430a interposed between the first carrier substrate 100 and the second carrier substrate 200 and surrounded by the first portion 420a of the encapsulating material 420. Moreover, the semiconductor package structure 20g does not have a TIM layer 410 interposed between the heat spreader 415 and the semiconductor die 300. In the embodiment, the encapsulating material 230 is interposed between the heat spreader 415 and the semiconductor die 300 to cover the upper surface of the semiconductor die 300.

Figure 14:
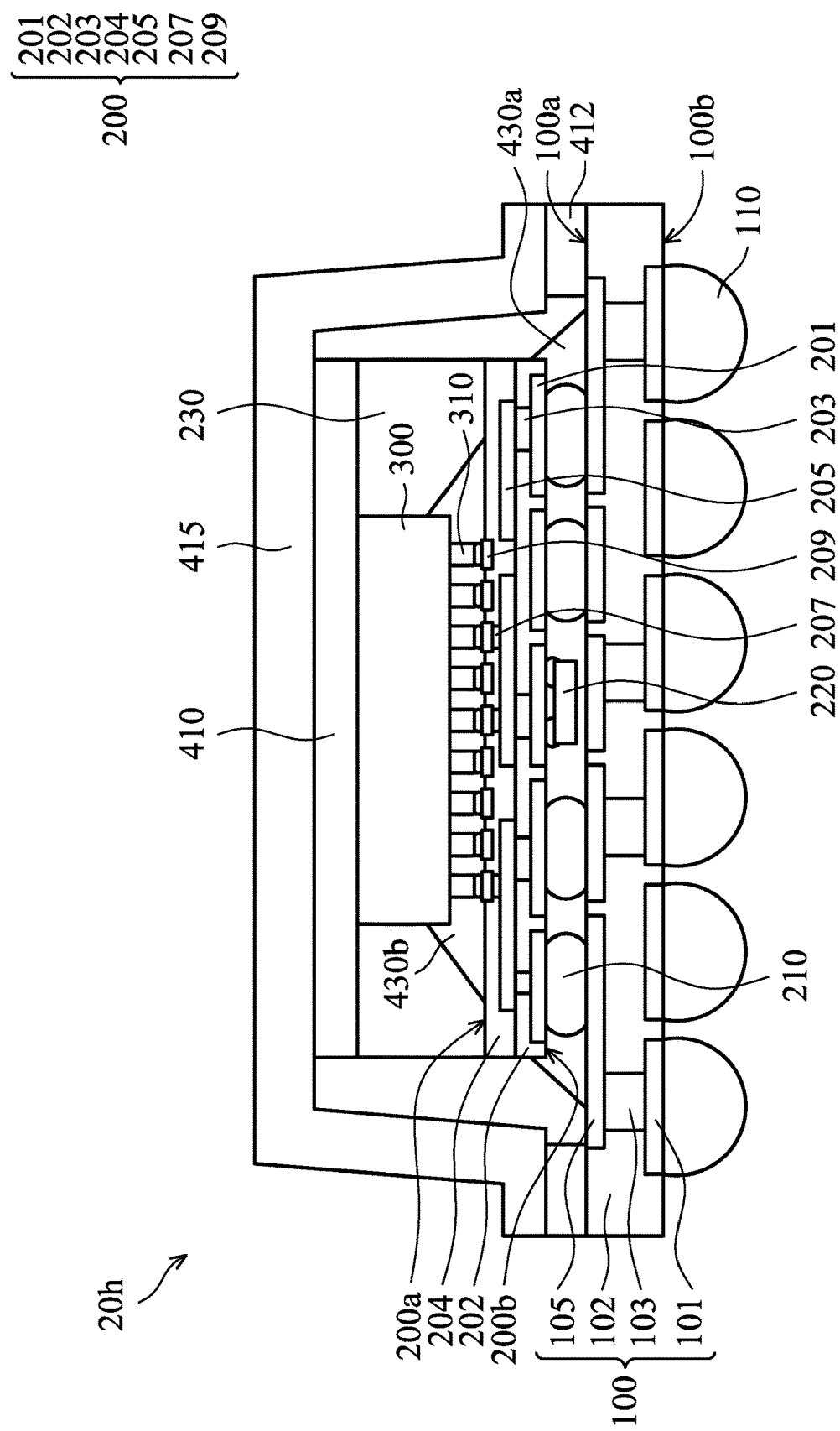
FIG. 14 is a cross-sectional view of a semiconductor package structure in accordance with some embodiments of the disclosure.

FIG. 14 is a cross-sectional view of a semiconductor package structure 20h in accordance with some embodiments of the disclosure. Descriptions of elements of the embodiments hereinafter that are the same as or similar to those previously described with reference to FIG. 10 may be omitted for brevity. In the embodiment, the semiconductor package structure 20h is similar to the semiconductor package structure 20d shown in FIG. 10. As shown in FIG. 14, unlike the semiconductor package structure 20d, the semiconductor package structure 20h does not have an encapsulating material 420. Accordingly, a gap 450 surrounding the TIM layer 410, the encapsulating material 230, the second carrier substrate 200, and the underfill material layer 430a is formed.

Figure 15:
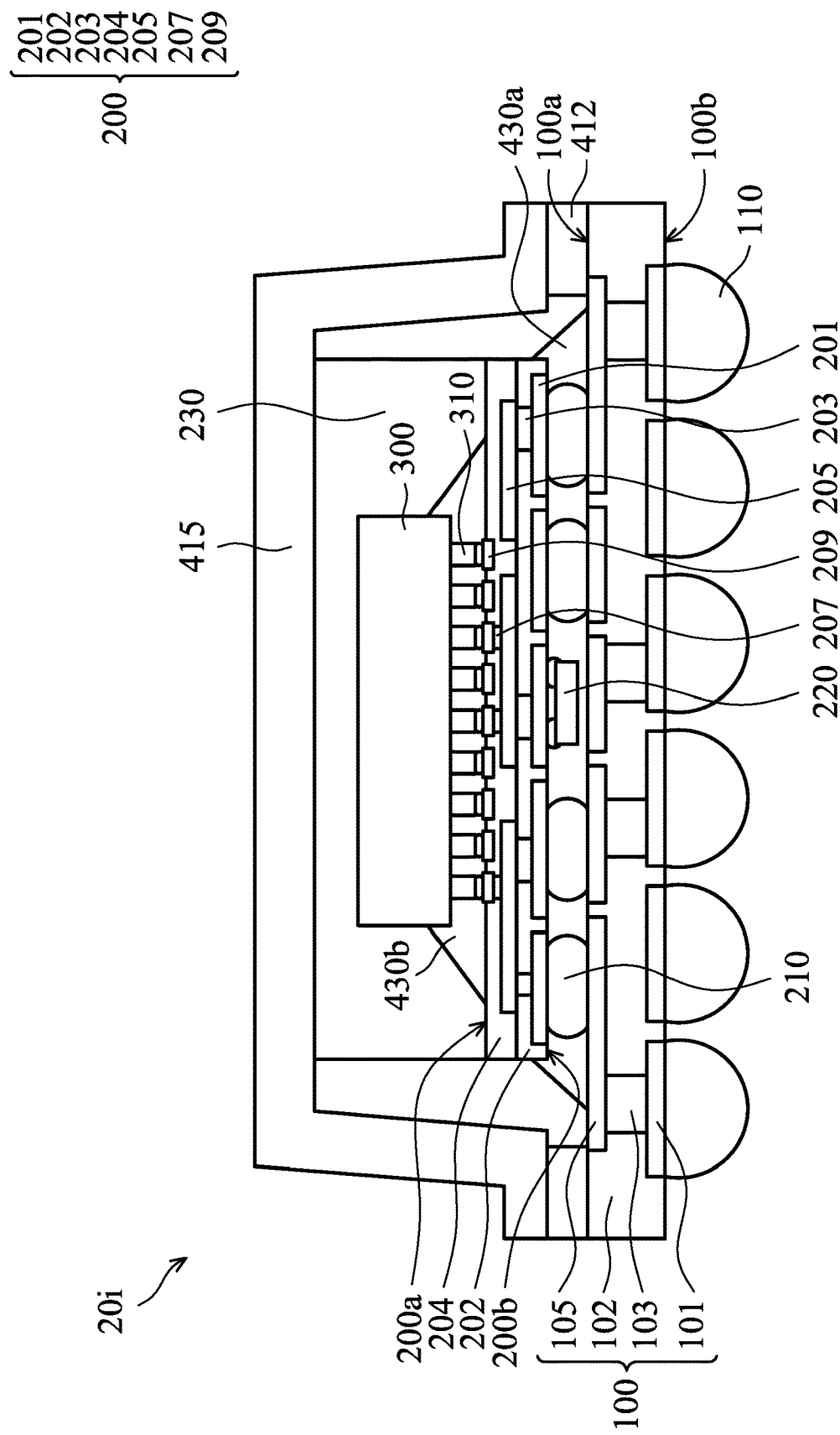
FIG. 15 is a cross-sectional view of a semiconductor package structure in accordance with some embodiments of the disclosure.

FIG. 15 is a cross-sectional view of a semiconductor package structure 20i in accordance with some embodiments of the disclosure. Descriptions of elements of the embodiments hereinafter that are the same as or similar to those previously described with reference to FIG. 11 may be omitted for brevity. In the embodiment, the semiconductor package structure 20i is similar to the semiconductor package structure 20e shown in FIG. 11. As shown in FIG. 15, unlike the semiconductor package structure 20e, the semiconductor package structure 20i does not have an encapsulating material 420. Accordingly, a gap 450 surrounding the TIM layer 410, the encapsulating material 230, the second carrier substrate 200, and the underfill material layer 430a is formed.

Figure 16:
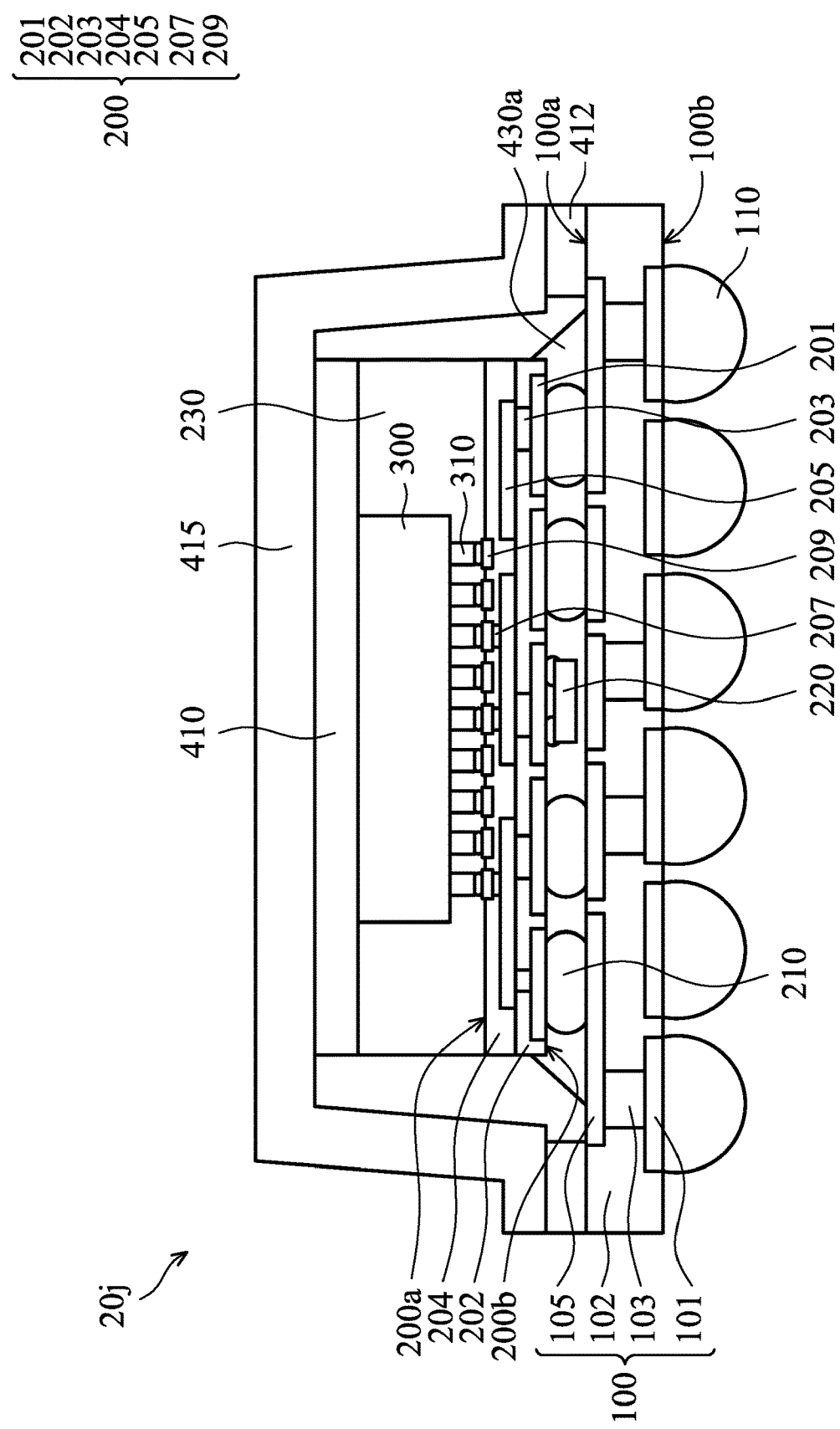
FIG. 16 is a cross-sectional view of a semiconductor package structure in accordance with some embodiments of the disclosure.

FIG. 16 is a cross-sectional view of a semiconductor package structure 20j in accordance with some embodiments of the disclosure. Descriptions of elements of the embodiments hereinafter that are the same as or similar to those previously described with reference to FIG. 12 may be omitted for brevity. In the embodiment, the semiconductor package structure 20j is similar to the semiconductor package structure 20f shown in FIG. 12. As shown in FIG. 16, unlike the semiconductor package structure 20f, the semiconductor package structure 20j does not have an encapsulating material 420. Accordingly, a gap 450 surrounding the TIM layer 410, the encapsulating material 230, the second carrier substrate 200, and the underfill material layer 430a is formed.

Figure 17:
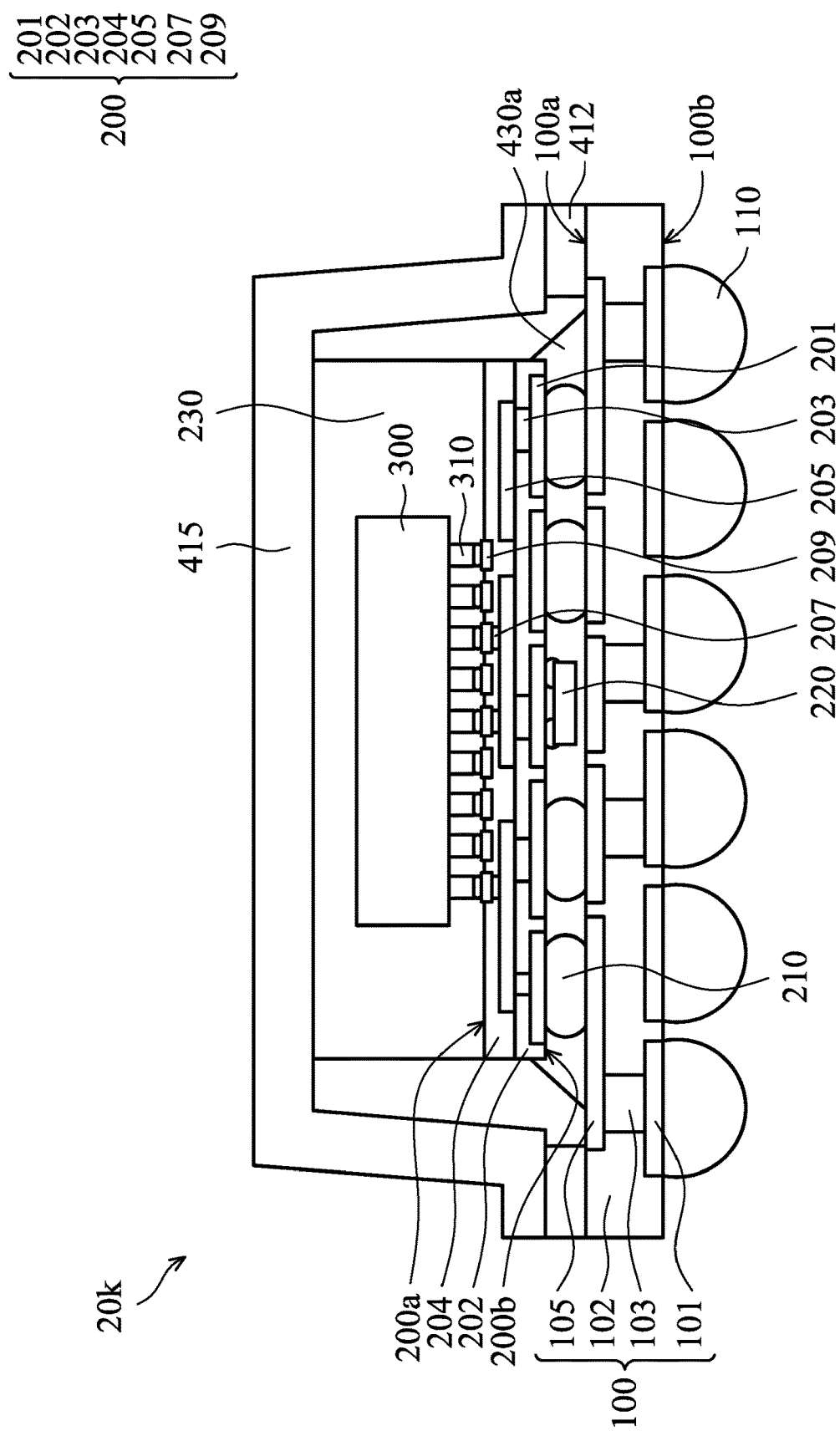
FIG. 17 is a cross-sectional view of a semiconductor package structure in accordance with some embodiments of the disclosure.

FIG. 17 is a cross-sectional view of a semiconductor package structure 20k in accordance with some embodiments of the disclosure. Descriptions of elements of the embodiments hereinafter that are the same as or similar to those previously described with reference to FIG. 13 may be omitted for brevity. In the embodiment, the semiconductor package structure 20k is similar to the semiconductor package structure 20g shown in FIG. 13. As shown in FIG. 17, unlike the semiconductor package structure 20g, the semiconductor package structure 20k does not have an encapsulating material 420. Accordingly, a gap 450 surrounding the TIM layer 410, the encapsulating material 230, the second carrier substrate 200, and the underfill material layer 430a is formed.

FIGS. 1A to 1E are cross-sectional views of various stages of a method for forming a semiconductor package structure 10a, in accordance with some embodiments of the disclosure. Additional operations can be provided before, during, and/or after the stages described in FIGS. 1A to 1E. Some of the stages that are described can be replaced or eliminated for different embodiments. Additional features can be added to the semiconductor package structure 10a. Some of the features described below can be replaced or eliminated for different embodiments.

As shown in FIG. 1A, a first carrier substrate 100 having a first surface 100a and an opposing second surface 100b and a second carrier substrate 200 having a first surface 200a and an opposing second surface 200b are provided. In some embodiments, the first carrier substrate 100 is a single layered package substrate and the second carrier substrate 200 is a dual layered package substrate. In those cases, the first carrier substrate 100 may include an insulating layer 102 and conductive traces 101 and 105 that are electrically coupled from each other through conductive vias 103. The conductive traces 101 and 105 are respectively disposed on the bottom and top surfaces of the insulating layer 102 (i.e., the second surface 100b and the first surface 100a of the first carrier substrate 100) and the conductive vias 103 are disposed in the insulating layer 102.

Moreover, the second carrier substrate 200 may include insulating layers 202 and 204 and conductive traces 201, 205 and 209 that are electrically coupled from each other through conductive vias 203 and 207. For example, the conductive traces 201 are disposed on the bottom surface of the insulating layer 202 (i.e., the second surface 200b of the second carrier substrate 200). The conductive traces 209 are disposed on the top surface of the insulating layer 204 (i.e., the first surface 200a of the second carrier substrate 200). The conductive traces 205 are disposed on the top surface of the insulating layer 202 or the bottom surface of the insulating layer 204. Moreover, conductive vias 203 are disposed in the insulating layer 202 between the conductive traces 201 and 205. Moreover, conductive vias 207 are disposed in the insulating layer 204 between the conductive traces 205 and 209. Additionally, conductive structures 210 (such as solder balls) and at least one passive device 220 (such as a capacitor) is mounted on the second surface 200b of the carrier substrate 200. In some other embodiments, the passive device 220 may be mounted on the first surface 200b of the second carrier substrate 200 or the first surface 100a of the first carrier substrate 100.

Next, the second carrier substrate 200 is stacked on the first carrier substrate 100, so that the second surface 200b of the second carrier substrate 200 faces the first surface 100a of the first carrier substrate 100 and is electrically coupled to the first carrier substrate 100 via conductive structures 210.

As shown in FIG. 1B, a semiconductor die 300 is provided. In some embodiments, the semiconductor die 300 (such as a system-on-chip (SOC) die) may include a logic die including a CPU, a GPU, a DRAM controller or any combination thereof. Alternatively, the semiconductor die 300 may include a modem die. Next, the semiconductor die 300 is stacked on the first surface 200a of the second carrier substrate 200, so that the second carrier substrate 200 is electrically coupled to the semiconductor die 300 via conductive structures 310 (such as solder bumps). In some embodiments, after the second carrier substrate 200 and the semiconductor die 300 are successively stacked on the first carrier substrate 100, a reflow process may be performed, so that the second carrier substrate 200 is mounted onto the first carrier substrate 100 through the conductive structures 210 and the semiconductor die 300 is mounted onto the second carrier substrate 200 through the conductive structures 310.

As shown in FIG. 1C, an optional TIM layer 410 may be formed on the semiconductor die 300 and an adhesive layer 412 (such as a TIA layer) may be formed on the first surface 100a of the first carrier substrate 100 via by respective dispensing processes. Afterwards, a heat spreader 415 is formed on the TIM layer 410 and the first surface 100a of the first carrier substrate 100 so as to form a cavity between the heat spreader 415 and the first carrier substrate 100. In some embodiments, a curing process is performed on the TIM layer 410 and the adhesive layer 412, so that the heat spreader 415 is fixed on the first surface 100a of the first carrier substrate 100 via the adhesive layer 412 and adhered to the semiconductor die 300 via the TIM layer 410. The second carrier substrate 200 and the semiconductor die 300 which are in the cavity, so that the heat spreader 415 covers and surrounds second carrier substrate 200 and the semiconductor die 300.

As shown in FIG. 1D, an encapsulating material 420, such as a molding compound, is formed on the first carrier substrate 100. In some embodiments, the encapsulating material 420 has a first portion 420a and a second portion 420b. The first portion 420a of the encapsulating material 420 may be in the cavity created by the heat spreader 415 and the first carrier substrate 100, so that the first portion 420a of the encapsulating material 420 is covered by the heat spreader 415, and the second carrier substrate 200 and the semiconductor die 300 are surrounded by the first portion 420a of the encapsulating material 420. Also, the gap between the semiconductor die 300 and the second carrier substrate 200 and the gap between the second carrier substrate 200 and the first carrier substrate 100 are filled with the first portion 420a of the encapsulating material 420. Moreover, the second portion 420b of the encapsulating material 420 surrounds an exterior sidewall 415a of the heat spreader 415 and exposes a portion of the heat spreader 415 that covers the first portion 420a of the encapsulating material 420 and the semiconductor die 300. Alternatively, the encapsulating material 420 is merely covered by the heat spreader 415 without surrounding the exterior sidewall 415a of the heat spreader 415

As shown in FIG. 1E, bumps 110 (such as solder balls) are formed on the second surface 100b of the first carrier substrate 100 so as to complete the fabrication of the semiconductor package structure 10a.

FIGS. 2A to 2F are cross-sectional views of various stages of a method for forming a semiconductor package structure 20a, in accordance with some embodiments of the disclosure. Descriptions of elements of the embodiments hereinafter that are the same as or similar to those previously described with reference to FIGS. 1A to 1E may be omitted for brevity. Additional operations can be provided before, during, and/or after the stages described in FIGS. 2A to 2F. Some of the stages that are described can be replaced or eliminated for different embodiments. Additional features can be added to the semiconductor package structure 20a. Some of the features described below can be replaced or eliminated for different embodiments.

As shown in FIG. 2A, a second carrier substrate 200 having a first surface 200a and an opposing second surface 200b and a semiconductor die 300 are provided. Next, the semiconductor die 300 is stacked on the first surface 200a of the second carrier substrate 200, so that the second carrier substrate 200 is electrically coupled to the semiconductor die 300 via conductive structures 310 (such as solder bumps). In some embodiments, after the semiconductor die 300 is stacked on the second carrier substrate 200, a reflow process may be performed, so that the semiconductor die 300 is mounted onto the second carrier substrate 200 through the conductive structures 310.

As shown in FIG. 2B, an encapsulating material 230, such as a molding compound, is formed on the first surface 200a of the second carrier substrate 200 to surround the semiconductor die 300 and expose the upper surface of the semiconductor die 300. Also, the gap between the semiconductor die 300 and the second carrier substrate 200 is filled with the encapsulating material 230. Afterwards, conductive structures 210 (such as solder balls) and at least one passive device 220 (such as a capacitor) is mounted on the second surface 200b of the carrier substrate 200. In some other embodiments, the passive device 220 may be mounted on the first surface 200b of the second carrier substrate 200.

As shown in FIG. 2C, a first carrier substrate 100 having a first surface 100a and an opposing second surface 100b is provided. The second carrier substrate 200 with the semiconductor die 300 and the encapsulating material 230 is stacked on the first surface 100a of the first carrier substrate 100. In some embodiments, after the structure shown in FIG. 2B is stacked on the first carrier substrate 100, a reflow process may be performed, so that the second carrier substrate 200 with the semiconductor die 300 and the encapsulating material 230 is mounted onto the first carrier substrate 100 through the conductive structures 210.

As shown in FIG. 2D, an optional TIM layer 410 may be formed on the semiconductor die 300 and the encapsulating material 230 and an adhesive layer 412 (such as a TIA layer) may be formed on the first surface 100a of the first carrier substrate 100 via by respective dispensing processes. In some embodiments, an edge 400a of the TIM layer 410 is substantially aligned to an edge 230a of the encapsulating material 230.

Afterwards, a heat spreader 415 is formed on the TIM layer 410 and the first surface 100a of the first carrier substrate 100 so as to form a cavity between the heat spreader 415 and the first carrier substrate 100. In some embodiments, a curing process is performed on the TIM layer 410 and the adhesive layer 412, so that the heat spreader 415 is fixed on the first surface 100a of the first carrier substrate 100 via the adhesive layer 412 and adhered to the semiconductor die 300 and the encapsulating material 230 via the TIM layer 410. The second carrier substrate 200 and the semiconductor die 300 which are in the cavity, so as to be covered and surrounded by the heat spreader 415.

As shown in FIG. 2E, an encapsulating material 420, such as a molding compound, is formed on the first carrier substrate 100. In some embodiments, the passive device 220 is not mounted on the second carrier substrate 200 and may be mounted on the first surface 100a of the first carrier substrate 100 prior to formation of the encapsulating material 420.

In some embodiments, the encapsulating material 420 has a first portion 420a and a second portion 420b. The first portion 420a of the encapsulating material 420 is covered by the heat spreader 415, and the second carrier substrate 200 and the encapsulating material 230 are surrounded by the first portion 420a of the encapsulating material 420. Also, the gap between the second carrier substrate 200 and the first carrier substrate 100 is filled with the first portion 420a of the encapsulating material 420. Moreover, the second portion 420b of the encapsulating material 420 surrounds an exterior sidewall 415a of the heat spreader 415 and exposes a portion of the heat spreader 415 that covers the first portion 420a of the 420, the encapsulating material 230 and the semiconductor die 300. Alternatively, the encapsulating material 420 is merely covered by the heat spreader 415 without surrounding the exterior sidewall 415a of the heat spreader 415.

As shown in FIG. 2F, bumps 110 (such as solder balls) are formed on the second surface 100b of the first carrier substrate 100 so as to complete the fabrication of the semiconductor package structure 20a.

Although the method for forming the semiconductor package structure 10a is shown in FIGS. 1A to 1E and the method for forming the semiconductor package structure 20a is shown in FIGS. 2A to 2F, the semiconductor package structures 10b to 10f respectively shown in FIGS. 3 to 7 and the semiconductor package structures 20b to 20k respectively shown in FIGS. 8 to 17 may be fabricated by the method same as or similar to the method for forming the semiconductor package structure 10a or the method for forming the semiconductor package structure 10a.

According to the foregoing embodiments, since the semiconductor package structure utilizes a combination of first and second carrier substrates (i.e., package substrates) as a fan-out layer for a semiconductor die in the semiconductor package structure, compared to a conventional semiconductor package structure that merely utilizes a single package substrate with a complicated multilayer interconnect structure therein as a fan-out layer, the number of interconnect layers in the package substrates and the entire thickness of the package substrates can be reduced, so as to simplify the semiconductor package structure and reduce the manufacturing cost of the semiconductor package structure.

In the semiconductor package structure, the encapsulating material that surrounds the semiconductor die and be covered by the heat spreader can provide vertical and lateral paths for heat dissipation. As a result, the reliability of the semiconductor package structure can be increased. Moreover, since the encapsulating material is formed on the first carrier substrate and encapsulates the second carrier substrate, warpage of the semiconductor package structure can be mitigated or improved.

Additionally, since the passive device can be mounted on the upper surface of the first carrier substrate, the upper surface of the second carrier substrate, or the lower surface of the second carrier substrate, the design flexibility for conductive structures (e.g., solder balls) between the first and second carrier substrates can be increased. Moreover, in the case of the passive device mounted on the lower surface of the second carrier substrate, the passive device can be protected and supported by the encapsulating material. As a result, the passive device can be prevented from falling off, thereby addressing the rework issue for the passive device or the second carrier substrate.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
a first carrier substrate having a first surface and an opposing second surface;
a second carrier substrate stacked on the first carrier substrate and having a first surface and an opposing second surface that faces the first surface of the first carrier substrate;
a semiconductor die mounted on the first surface of the second carrier substrate;
a heat spreader disposed on the first surface of the first carrier substrate to cover and surround the second carrier substrate and the semiconductor die an encapsulating material having a first portion covered by the heat spreader, so that the second carrier substrate and the semiconductor die are surrounded by the first portion of the encapsulating material; and
at least one capacitor mounted on the second surface of the second carrier substrate; wherein
the at least one capacitor is surrounded and supported by the first portion of the encapsulating material,
wherein the first portion of the encapsulating material is a continuous region and physically contacts the semiconductor die.

2. The semiconductor package structure as claimed in claim 1, wherein the encapsulating material further comprises a second portion surrounding an exterior sidewall of the heat spreader.

3. The semiconductor package structure as claimed in claim 1, wherein the first portion of the encapsulating material covers an upper surface of the semiconductor die.

4. The semiconductor package structure as claimed in claim 1, further comprising a thermal interface material layer adhered between the semiconductor die and the heat spreader.

5. The semiconductor package structure as claimed in claim 1, further comprising an underfill material layer interposed between the first carrier substrate and the second carrier substrate.

6. The semiconductor package structure as claimed in claim 1, further comprising an underfill material layer interposed between the semiconductor die and the second carrier substrate.

7. The semiconductor package structure as claimed in claim 1, further comprising:
a first underfill material layer interposed between the first carrier substrate and the second carrier substrate; and
a second underfill material layer interposed between the semiconductor die and the second carrier substrate,
wherein a gap surrounds the semiconductor die, the second carrier substrate, the first underfill material layer, and the second underfill material layer.

8. The semiconductor package structure as claimed in claim 1,
wherein the first carrier substrate is a single layered package substrate with conductive structures on the first surface of the first carrier substrate and bumps on the second surface of the first carrier substrate, and the second carrier substrate is a dual layered package substrate.

9. A semiconductor package structure, comprising:
a first carrier substrate having a first surface and an opposing second surface;
a second carrier substrate stacked on the first carrier substrate and having a first surface and an opposing second surface that faces the first surface of the first carrier substrate;
a semiconductor die mounted on the first surface of the second carrier substrate;

a first encapsulating material disposed on the first surface of the second carrier substrate and surrounding the semiconductor die;

a heat spreader disposed on the first surface of the first carrier substrate to cover and surround the second carrier substrate and the first encapsulating material;

a second encapsulating material having a first portion covered by the heat spreader, so that the second carrier substrate and the first encapsulating material are surrounded by the first portion of the second encapsulating material; and at least one capacitor mounted on the second surface of the second carrier substrate;

wherein the at least one capacitor is surrounded and supported by the first portion of the second encapsulating material, wherein the first portion of the second encapsulating material is a continuous region.

10. The semiconductor package structure as claimed in claim 9, wherein the second encapsulating material further comprises a second portion surrounding an exterior sidewall of the heat spreader.

11. The semiconductor package structure as claimed in claim 9, further comprising a thermal interface material layer adhered between the semiconductor die and the heat spreader.

12. The semiconductor package structure as claimed in claim 11, wherein an edge of the thermal interface material layer is substantially aligned to an edge of the first encapsulating material.

13. The semiconductor package structure as claimed in claim 9, further comprising an underfill material layer interposed between the semiconductor die and the second carrier substrate and surrounded by the first encapsulating material.

14. The semiconductor package structure as claimed in claim 13, wherein the first encapsulating material covers an upper surface of the semiconductor die.

15. The semiconductor package structure as claimed in claim 9, further comprising an underfill material layer interposed between the first carrier substrate and the second carrier substrate.

16. The semiconductor package structure as claimed in claim 15, further comprising a second underfill material layer interposed between the semiconductor die and the second carrier substrate and surrounded by the first encapsulating material.

17. The semiconductor package structure as claimed in claim 16, wherein the first encapsulating material covers an upper surface of the semiconductor die.

18. The semiconductor package structure as claimed in claim 15, wherein the first encapsulating material covers an upper surface of the semiconductor die.

19. The semiconductor package structure as claimed in claim 9, further comprising a first underfill material layer interposed between the first carrier substrate and the second carrier substrate, wherein a gap surrounds the first encapsulating material, the second carrier substrate, and the first underfill material layer.

20. The semiconductor package structure as claimed in claim 19, further comprising a second underfill material layer interposed between the semiconductor die and the second carrier substrate and surrounded by the first encapsulating material.

21. The semiconductor package structure as claimed in claim 20, wherein the first encapsulating material covers an upper surface of the semiconductor die.

22. The semiconductor package structure as claimed in claim 19, wherein the first encapsulating material covers an upper surface of the semiconductor die.

23. The semiconductor package structure as claimed in claim 9, wherein the first carrier substrate is a single layered package substrate with conductive structures on the first surface of the first carrier substrate and bumps on the second surface of the first carrier substrate, and the second carrier substrate is a dual layered package substrate.

* * * * *